United States Patent
Crosby, Jr. et al.

(10) Patent No.: US 12,041,757 B2
(45) Date of Patent: Jul. 16, 2024

(54) SIDEWALL-CONNECTED HVAC UNITS FOR MODULAR DATACENTER FACILITIES

(71) Applicant: Compass Datacenters LLC, Dallas, TX (US)

(72) Inventors: Christopher J. Crosby, Jr., Dallas, TX (US); Jose Alberto Ruiz, Frisco, TX (US)

(73) Assignee: Compass Datacenters, LLC, Dallas, TX (US)

( * ) Notice: Subject to any disclaimer, the term of this patent is extended or adjusted under 35 U.S.C. 154(b) by 375 days.

(21) Appl. No.: 17/195,209

(22) Filed: Mar. 8, 2021

(65) Prior Publication Data
US 2021/0274686 A1  Sep. 2, 2021

Related U.S. Application Data

(63) Continuation of application No. 15/464,059, filed on Mar. 20, 2017, now abandoned, which is a
(Continued)

(51) Int. Cl.
*H05K 7/20* (2006.01)
*E04B 1/18* (2006.01)
(Continued)

(52) U.S. Cl.
CPC .......... *H05K 7/20745* (2013.01); *E04B 1/18* (2013.01); *E04F 13/072* (2013.01);
(Continued)

(58) Field of Classification Search
CPC .... H05K 7/20745; H05K 7/1497; E04B 1/18; E04F 13/072; E04F 15/02405; E04H 2005/005
(Continued)

(56) References Cited

U.S. PATENT DOCUMENTS 2,555,009 A   5/1951   Claude
3,653,431 A   4/1972   Loveley
(Continued)

FOREIGN PATENT DOCUMENTS

GB   2467808 A   8/2010
WO   2010138771 A1   12/2010

OTHER PUBLICATIONS

"Hardening of Buildings and Structures", 2 pages, Hardened Structures Blast and Structural Engineering Team, Hardened Structures, Hardened Shelters, LLC downloaded Apr. 28, 2014 from http://www.hardenedstructures.com/hardening-of-buildings.php.
(Continued)

*Primary Examiner* — Allen R. B. Schult

(57) ABSTRACT

A modular datacenter facility and a method thereof is provided in accordance with some embodiments. The module datacenter facility can be constructed with an initial set of building modules of different types of functionality. A first building module can be a data-floor building module. A first set of sidewall-connected heating, ventilation, and air conditioning ("HVAC") units can connect to a sidewall of the modular datacenter facility and use electrical power provided by a first electrical power distribution building module to supply conditioned air into an air-supply plenum of the sidewall to cool computing systems housed in the data-floor building module. The first set of the sidewall-connected HVAC units allow for fewer penetrations in a roof of the data-floor building module, thereby minimizing an amount of leaks potentially occurring in the roof of the ceiling, and thereby minimizing risk of any damage to the computing systems.

19 Claims, 18 Drawing Sheets

Related U.S. Application Data continuation-in-part of application No. 14/463,474, filed on Aug. 19, 2014, now Pat. No. 9,603,281, and a continuation-in-part of application No. 14/041,351, filed on Sep. 30, 2013, now Pat. No. 9,671,837, said application No. 14/463,474 is a continuation-in-part of application No. 13/792,948, filed on Mar. 11, 2013, now Pat. No. 8,839,569.

(60) Provisional application No. 61/709,429, filed on Oct. 4, 2012, provisional application No. 61/609,812, filed on Mar. 12, 2012.

(51) Int. Cl.
| | | |
|---|---|---|
| *E04F 13/072* | (2006.01) | |
| *E04F 15/024* | (2006.01) | |
| *E04H 5/00* | (2006.01) | |
| *H05K 7/14* | (2006.01) | |

(52) U.S. Cl.
CPC ..... *E04F 15/02405* (2013.01); *H05K 7/1497* (2013.01); *E04H 2005/005* (2013.01)

(58) Field of Classification Search
USPC .................................................. 361/679.49
See application file for complete search history.

(56) References Cited

U.S. PATENT DOCUMENTS

| | | | |
|---|---|---|---|
| 3,882,649 A | 5/1975 | Mah et al. | |
| 3,924,370 A | 12/1975 | Cauceglia et al. | |
| 3,948,383 A | 4/1976 | Janitsch et al. | |
| 3,958,960 A | 5/1976 | Bakke | |
| 4,137,895 A | 2/1979 | Bittinger | |
| 4,202,408 A | 5/1980 | Temple | |
| 4,380,215 A | 4/1983 | Mendelson | |
| 5,168,719 A | 12/1992 | Branz et al. | |
| 5,477,649 A | 12/1995 | Bessert | |
| 6,019,322 A | 2/2000 | Shimizu | |
| 6,508,583 B1 | 1/2003 | Shankwitz et al. | |
| 6,651,393 B2 | 11/2003 | Don et al. | |
| 6,656,036 B1 | 12/2003 | Quigley | |
| 6,862,179 B2* | 3/2005 | Beitelmal | H05K 7/20745 361/679.53 |
| 7,278,273 B1 | 10/2007 | Whitted et al. | |
| 7,724,513 B2 | 5/2010 | Coglitore et al. | |
| 7,738,251 B2 | 6/2010 | Clidaras et al. | |
| 7,971,446 B2 | 7/2011 | Clidaras et al. | |
| 8,218,322 B2 | 7/2012 | Clidaras et al. | |
| 8,514,572 B2 | 8/2013 | Rogers | |
| 8,839,569 B2 | 9/2014 | Crosby, Jr. | |
| 2005/0225936 A1 | 10/2005 | Day | |
| 2006/0087122 A1 | 4/2006 | Sheffield | |
| 2006/0260338 A1 | 11/2006 | VanGilder et al. | |
| 2007/0144079 A1 | 6/2007 | Hourihan | |
| 2007/0235136 A1 | 10/2007 | Enomoto et al. | |
| 2008/0243421 A1* | 10/2008 | Siegel | G01K 17/20 702/136 |
| 2008/0282979 A1 | 11/2008 | Chen et al. | |
| 2009/0058098 A1 | 3/2009 | Flynn | |
| 2009/0229194 A1 | 9/2009 | Armillas | |
| 2009/0275277 A1 | 11/2009 | Al-Alusi et al. | |
| 2009/0326279 A1 | 12/2009 | Tonkovich et al. | |
| 2010/0235206 A1 | 9/2010 | Miller et al. | |
| 2010/0247304 A1 | 9/2010 | Merchant et al. | |
| 2010/0302744 A1 | 12/2010 | Englert et al. | |
| 2011/0023388 A1 | 2/2011 | Tong et al. | |
| 2011/0074159 A1 | 3/2011 | Stromotich | |
| 2011/0083824 A1 | 4/2011 | Rogers | |
| 2011/0146164 A1 | 6/2011 | Haney et al. | |
| 2012/0242468 A1 | 9/2012 | Nakayama et al. | |
| 2012/0255710 A1 | 10/2012 | Maselli et al. | |
| 2012/0260587 A1 | 10/2012 | Pini | |
| 2012/0311781 A1 | 12/2012 | Purdy et al. | |
| 2013/0048266 A1 | 2/2013 | Bauchot et al. | |
| 2013/0232888 A1 | 9/2013 | Crosby, Jr. | |
| 2013/0260666 A1 | 10/2013 | Rodriquez et al. | |
| 2013/0293017 A1 | 11/2013 | Englert et al. | |
| 2014/0216259 A1 | 8/2014 | Iwaki | |

OTHER PUBLICATIONS

"HP Performance Optimized Datacenter" downloaded Feb. 26, 2013 from http://en.wikipedia.org/wiki/HP_Performance_Optimized_Datacenter&oldid=536557730, 4 pages.
"Sun Modular Datacenter", 4 pages. Copyright 2004—2009 Sun Microsystems, Inc.
Examiner's Report filed in Canadian Patent Application No. 2808914 dated Aug. 25, 2015, 5 pages.
Office Action issued in U.S. Appl. No. 13/792,948 dated Jan. 27, 2014.
Notice of Allowance issued in U.S. Appl. No. 13/792,948 dated Jun. 9, 2014.
Office Action issued in U.S. Appl. No. 14/463,474 dated Mar. 7, 2016.
Office Action issued in U.S. Appl. No. 14/463,474 dated Aug. 5, 2016.
Notice of Allowance issued in U.S. Appl. No. 14/463,474 dated Nov. 1, 2016.
Office Action issued in U.S. Appl. No. 14/041,351 dated Feb. 12, 2016.
Office Action issued in U.S. Appl. No. 14/041,351 dated Sep. 14, 2016.
Notice of Allowance issued in U.S. Appl. No. 14/041,351 dated Feb. 3, 2017.
Office Action issued in U.S. Appl. No. 15/464,059 dated Jul. 19, 2018.
Office Action issued in U.S. Appl. No. 15/464,059 dated Feb. 25, 2019.
Advisory Action issued in U.S. Appl. No. 15/464,059 dated Sep. 6, 2019.
Examiner's Answer Before the Patent and Trial Appeal Board issued in U.S. Appl. No. 15/464,059 dated Feb. 21, 2020.
Patent Trial and Appeal Board Decision on Appeal issued in U.S. Appl. No. 15/464,059 dated Jan. 8, 2021.

* cited by examiner

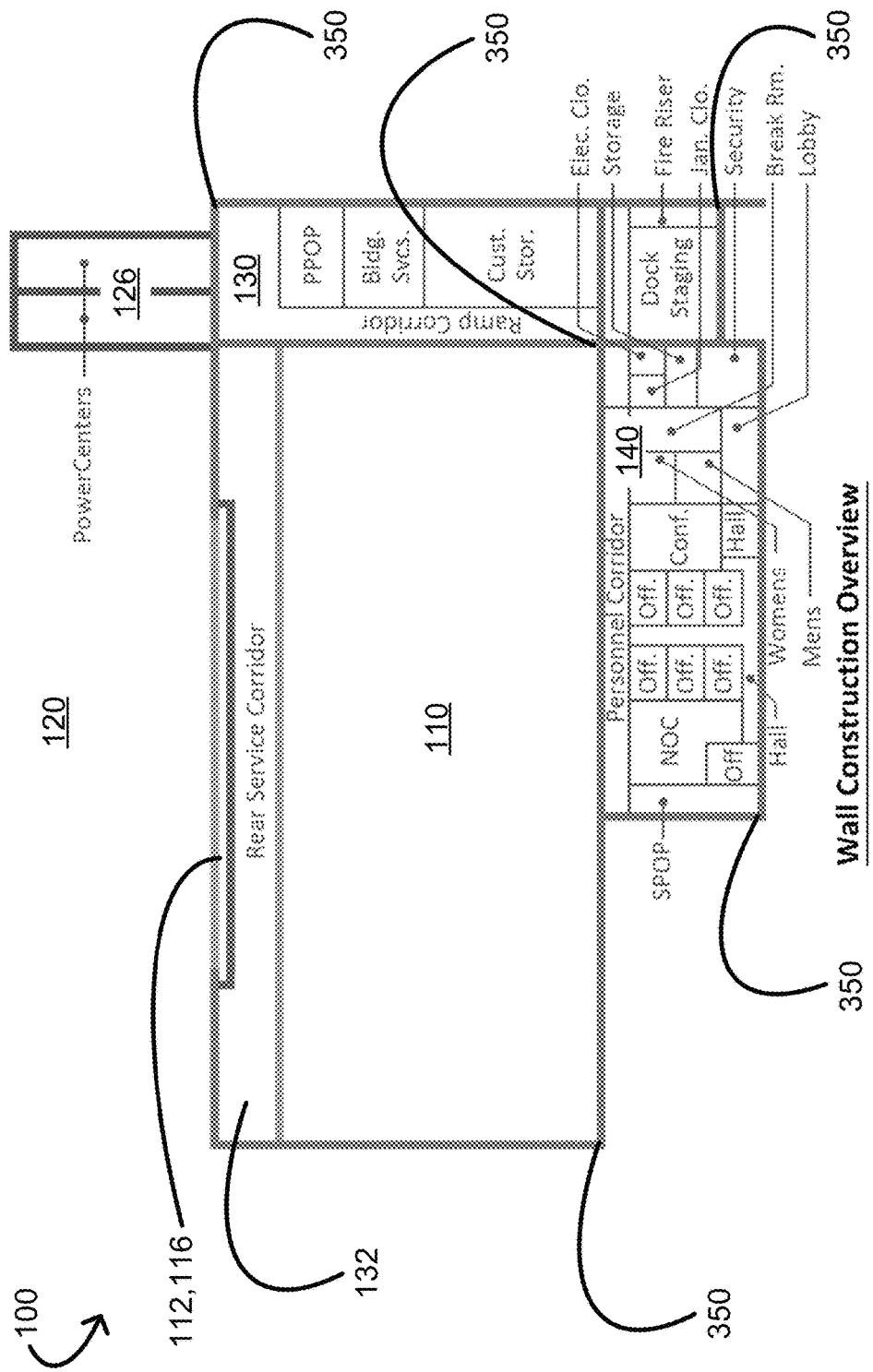

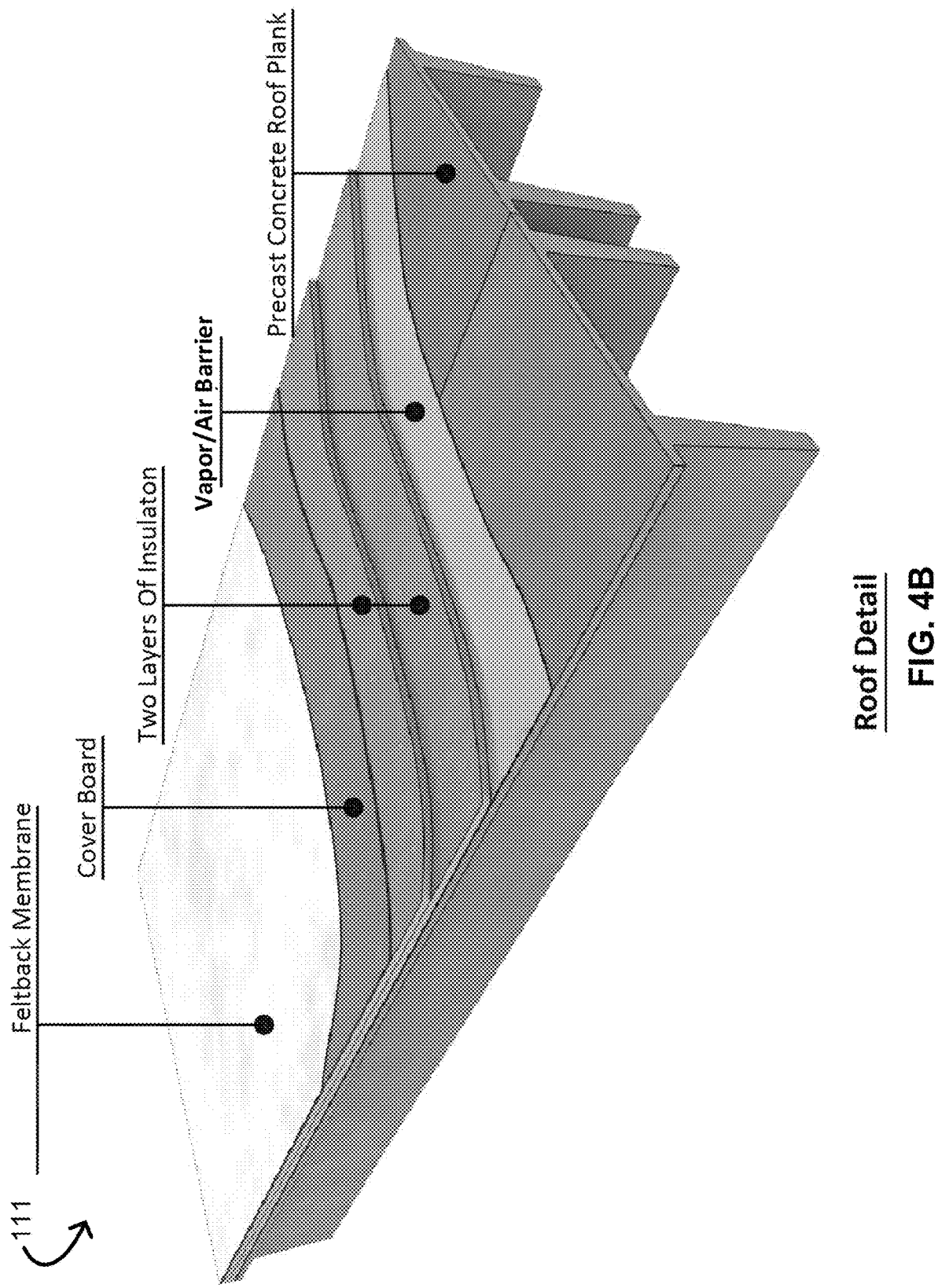

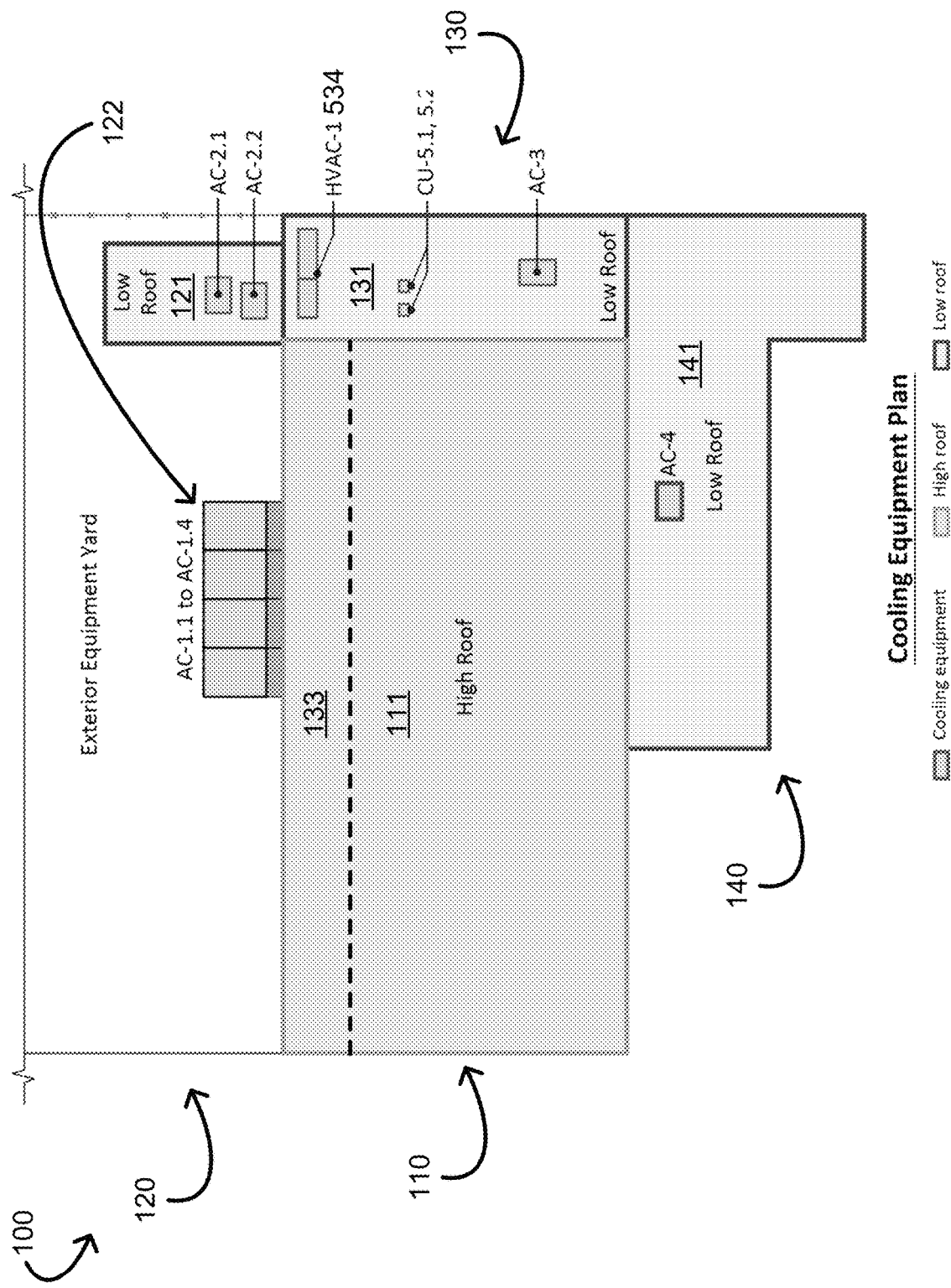

SIDEWALL-CONNECTED HVAC UNITS FOR MODULAR DATACENTER FACILITIES

CROSS REFERENCE

This application is a continuation of U.S. patent application Ser. No. 15/464,059, filed Mar. 20, 2017, which is a continuation-in-part of U.S. patent application Ser. No. 14/463,474, filed Aug. 19, 2014, now U.S. Pat. No. 9,603,281, which is a continuation-in-part of U.S. patent application Ser. No. 13/792,948, filed Mar. 11, 2013, now U.S. Pat. No. 8,839,569, which claims the benefit of U.S. Provisional Patent Application No. 61/609,812, filed Mar. 12, 2012, each of which applications is hereby incorporated herein by reference in its entirety.

This application is also a continuation of U.S. patent application Ser. No. 15/464,059, filed Mar. 20, 2017, which is a continuation-in-part of U.S. patent application Ser. No. 14/041,351, filed Sep. 30, 2013, now U.S. Pat. No. 9,671,837, which claims the benefit of U.S. Provisional Patent Application No. 61/709,429, filed Oct. 4, 2012, each of which applications is hereby incorporated herein by reference in its entirety.

TECHNICAL FIELD OF INVENTION

Electrical computers and digital data processing systems in a data center and air flow control for the electrical computers and digital data processing system.

BACKGROUND

Information Technology ("IT") operations are a crucial aspect of most organizational operations in the western world. One of the main concerns is business continuity. Companies rely on their information systems to run their operations. If a system becomes unavailable, company operations may be impaired or stopped completely. It is necessary to provide a reliable infrastructure for IT operations, in order to minimize any chance of disruption. Information security is also a concern, and for this reason a datacenter has to offer a secure environment, which minimizes the chances of a security breach. A datacenter must therefore keep high standards for assuring the integrity and functionality of its hosted computer environment. Telcordia GR-3160, NEBS Requirements for Telecommunications Data Center Equipment and Spaces, provides guidelines for datacenter spaces within telecommunications networks, and environmental requirements for the equipment intended for installation in those spaces.

Putting a large number of electrical components into a single enclosed space, such as a room, creates a ventilation problem as the area must be maintained at a desired operating temperature, while having a large number of heat sources. Traditional systems may create custom ducting to direct supply air into desired locations within a datacenter facility. Alternatively, through floor or ceiling supply paths may be created by forcing air in through grated floor or ceiling sections. However, existing designs suffer from localized heating and cooling caused by inadequate air distribution through the space.

SUMMARY

In an embodiment, a modular datacenter facility is provided, constructed with at least an initial set of building modules of different types of functionality to form the modular datacenter facility. Each type of building module in the set of building modules can have a collection of functionality associated with the type of building module. Each building module of the set of building modules can be a pre-engineered, standardized building block having a pre-approved architectural design and layout. A first type of building module in the modular datacenter facility can be a data-floor building module that is pre-engineered and has the pre-approved architectural design and layout to house computing systems. The computing systems include servers and storage devices housed in hot and cool zones of the data-floor building module, and routers and switches can be configured to transport data traffic between the servers as well as transport traffic to a world exterior to the modular datacenter facility. A first set of sidewall-connected heating, ventilation, and air conditioning ("HVAC") units for the data-floor building module can connect to a sidewall of the modular datacenter facility and use electrical power provided by a first electrical power distribution building module to supply conditioned air into an air-supply plenum of the sidewall, which can be a sidewall of the data-floor building module or a service corridor, in order to cool the computing systems including the servers, storage devices, routers, and switches, and other electronic components housed in the data-floor building module of the modular datacenter facility. The first set of the sidewall-connected HVAC units can be configured for cooling of the computing systems and the other electronic components allowing for more server units to consume electrical power during their operation inside the data-floor building module without raising a temperature in the data-floor building module high enough to overheat the computing systems and the other electronic components. The first set of the sidewall-connected HVAC units connecting to the sidewall allow for fewer penetrations in a roof or ceiling of the data-floor building module, thereby minimizing an amount of leaks potentially occurring in the roof of the ceiling, and thereby minimizing risk of any damage to the computing systems and the other electronic components housed in the data-floor building module from the leaks. The roof can include a vapor-to-air sealant layer on top of a concrete layer to further prevent leaks from potentially occurring in the data-floor building module from in through the roof.

In an embodiment, a method is provided for constructing a modular datacenter facility with at least an initial set of building modules of different types of functionality to form the modular datacenter facility. Each type of building module in the set of building modules can have a collection of functionality associated with the type of building module. Each building module of the set of building modules can be a pre-engineered, standardized building block having a pre-approved architectural design and layout. A first type of building module in the modular datacenter facility can be a data-floor building module that is pre-engineered and has the pre-approved architectural design and layout to house computing systems. The method can include housing, in hot and cool zones of the data-floor building module, the computing systems including servers and storage, as well as routers and switches configured to transport data traffic between the servers as well as transport traffic to a world exterior to the modular datacenter facility. The method can include connecting a first set of sidewall-connected HVAC units for the data-floor building module to a sidewall of the modular datacenter facility and, using electrical power provided by a first electrical power distribution building module, supplying conditioned air into an air-supply plenum of the sidewall, which can be a sidewall of the data-floor building module or a service corridor, in order to cool the computing systems including the servers, storage devices, routers, and switches, and other electronic components housed in the data-floor building module of the modular datacenter facility. The first set of the sidewall-connected HVAC units can be configured for cooling of the computing systems and the other electronic components allowing for more server units to consume electrical power during their operation inside the data-floor building module without raising a temperature in the data-floor building module high enough to overheat the computing systems and the other electronic components. The first set of the sidewall-connected HVAC units connecting to the sidewall allow for fewer penetrations in a roof or ceiling of the data-floor building module, thereby minimizing an amount of leaks potentially occurring in the roof of the ceiling, and thereby minimizing risk of any damage to the computing systems and the other electronic components housed in the data-floor building module from the leaks. The method can include sealing the roof with a vapor-to-air sealant layer on top of a concrete layer to further prevent leaks from potentially occurring in the data-floor building module from in through the roof.

DRAWINGS

The drawings refer to embodiments of the design in which:

FIGS. 1A, 1B, and 1C illustrate block diagrams modular datacenter facilities constructed with sets of building modules of different types of functionality to form entire datacenter facilities having standardized pre-approved architectural designs and layouts in accordance with some embodiments.

FIG. 3 illustrates a hardened-structure building module of a modular datacenter facility in accordance with some embodiments.

FIG. 4B illustrates layers of a roof of a roofing system of a modular datacenter facility in accordance with some embodiments.

FIG. 5 illustrates an HVAC system of a modular datacenter facility in accordance with some embodiments.

Figure 6A:
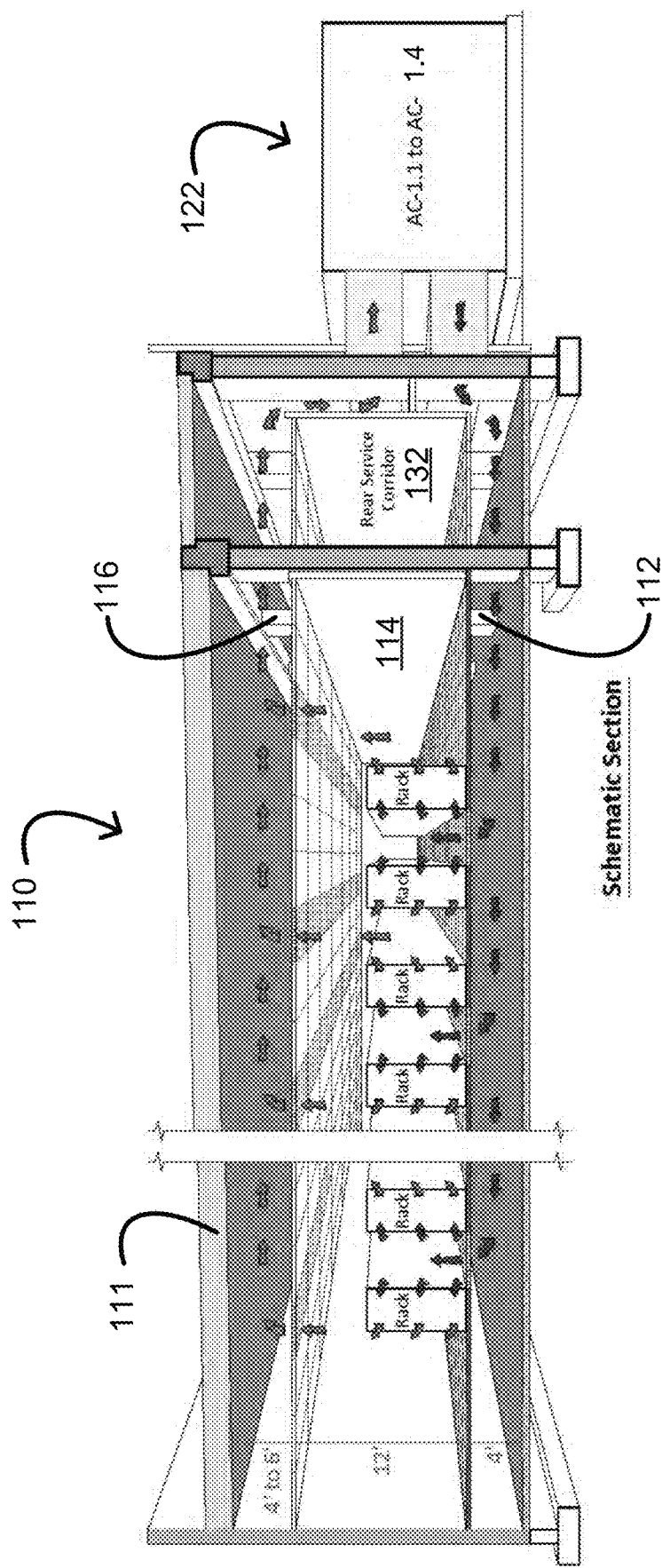
Figure 6B:
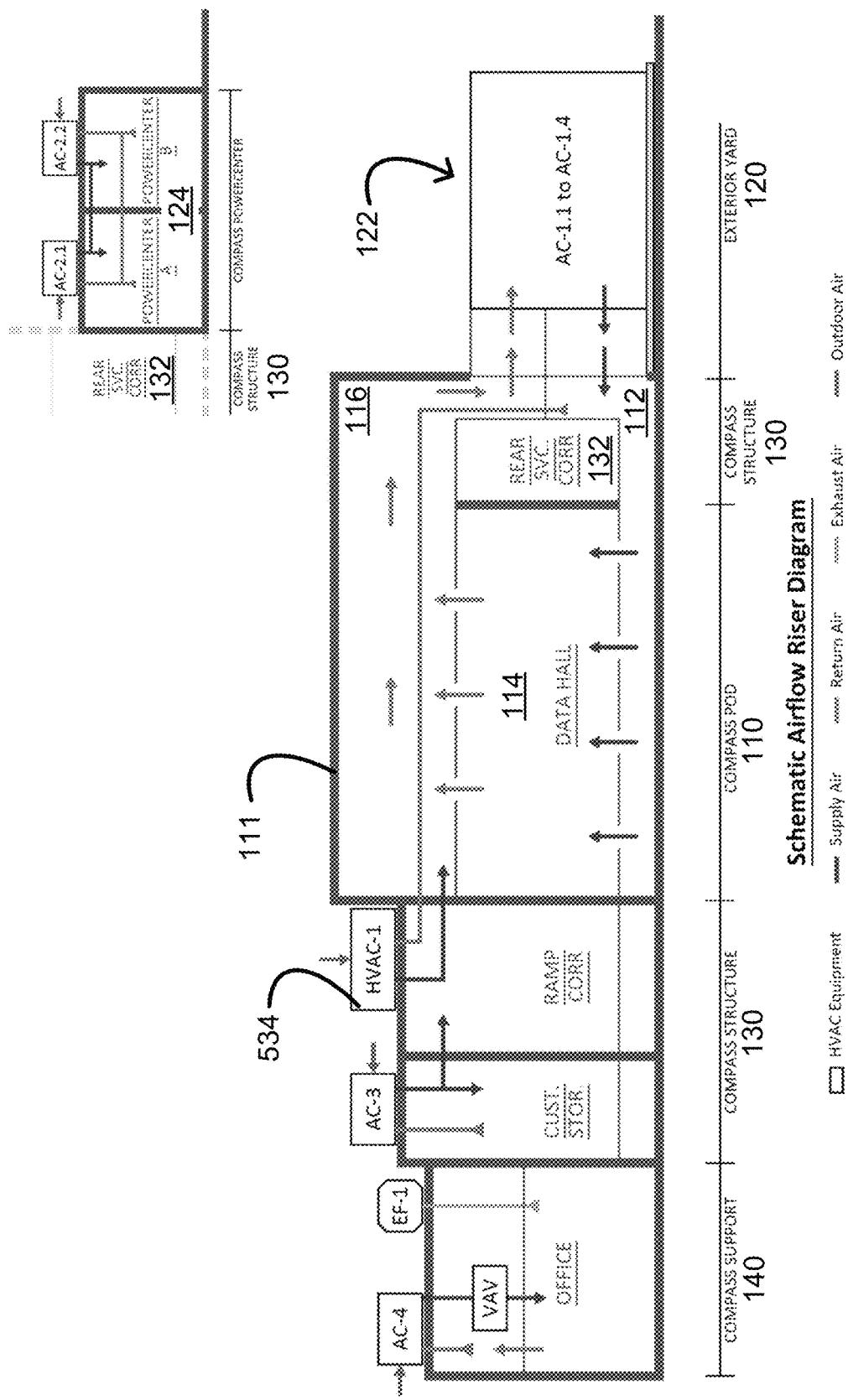
Figure 6C:
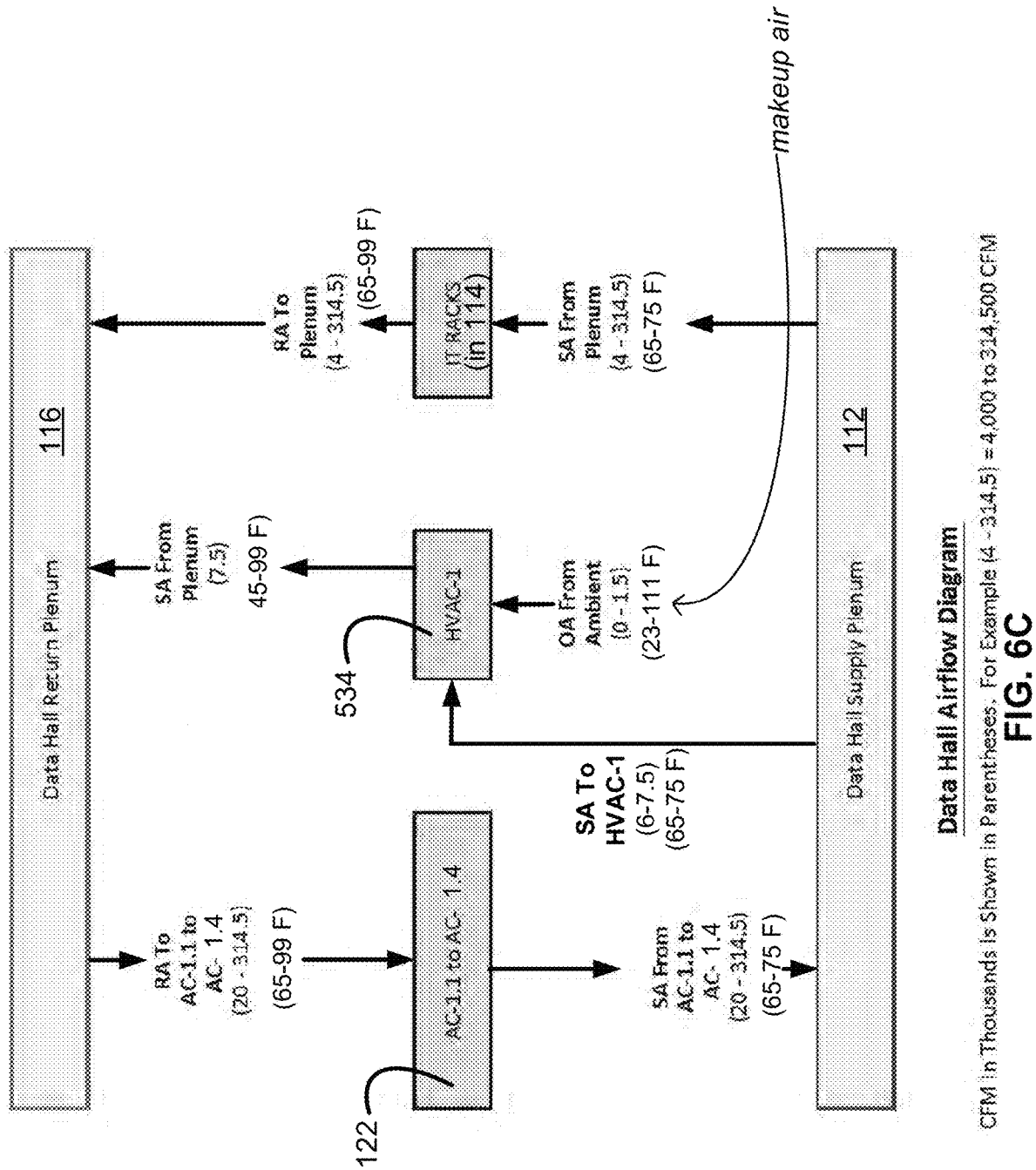

FIGS. 6A, 6B, and 6C illustrate air flow through a data-floor building module of a modular datacenter facility in accordance with some embodiments.

Figure 7:
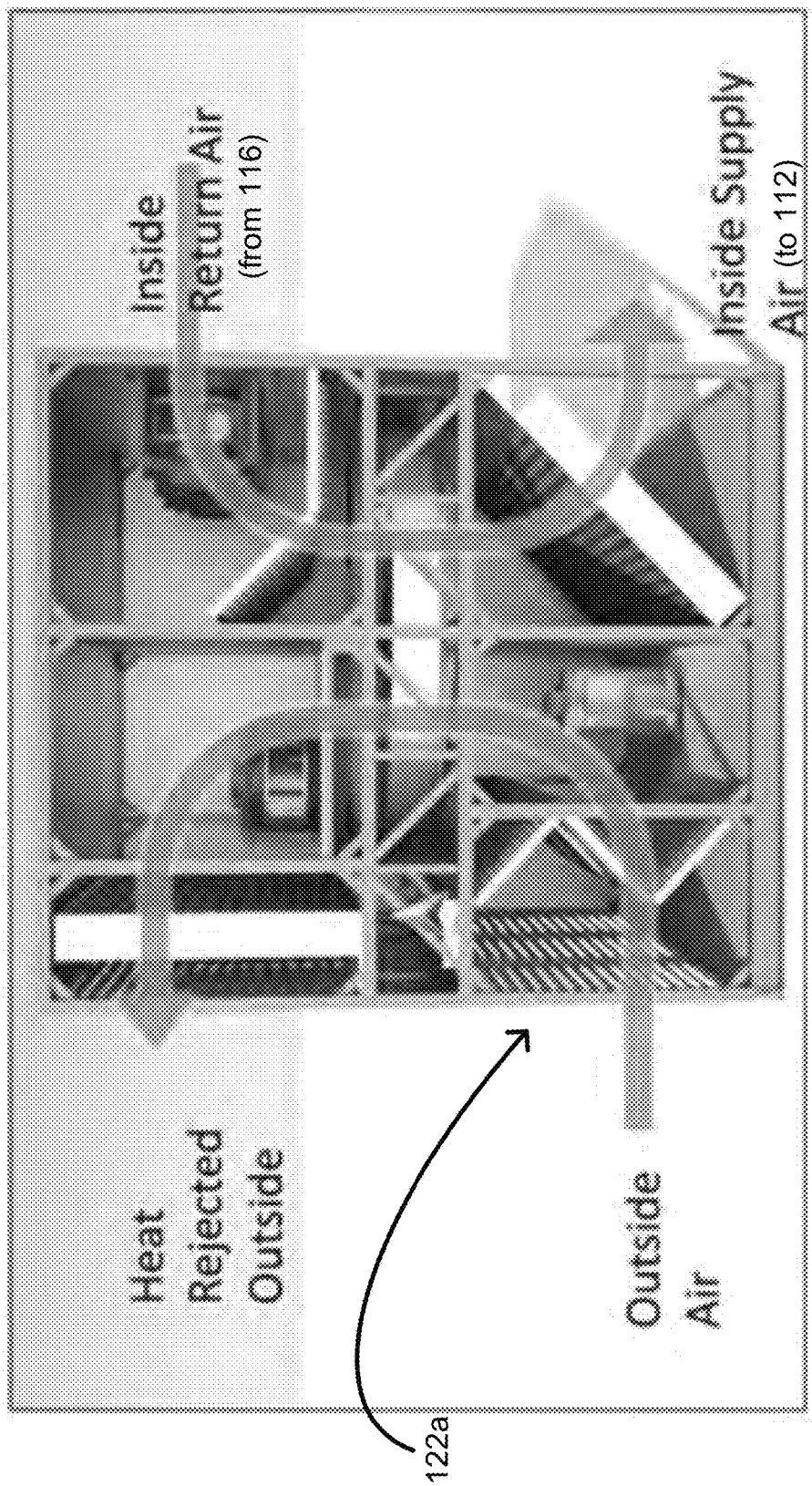

FIG. 7 illustrates heat exchange-based cooling of HVAC units in accordance with some embodiments.

Figure 8:
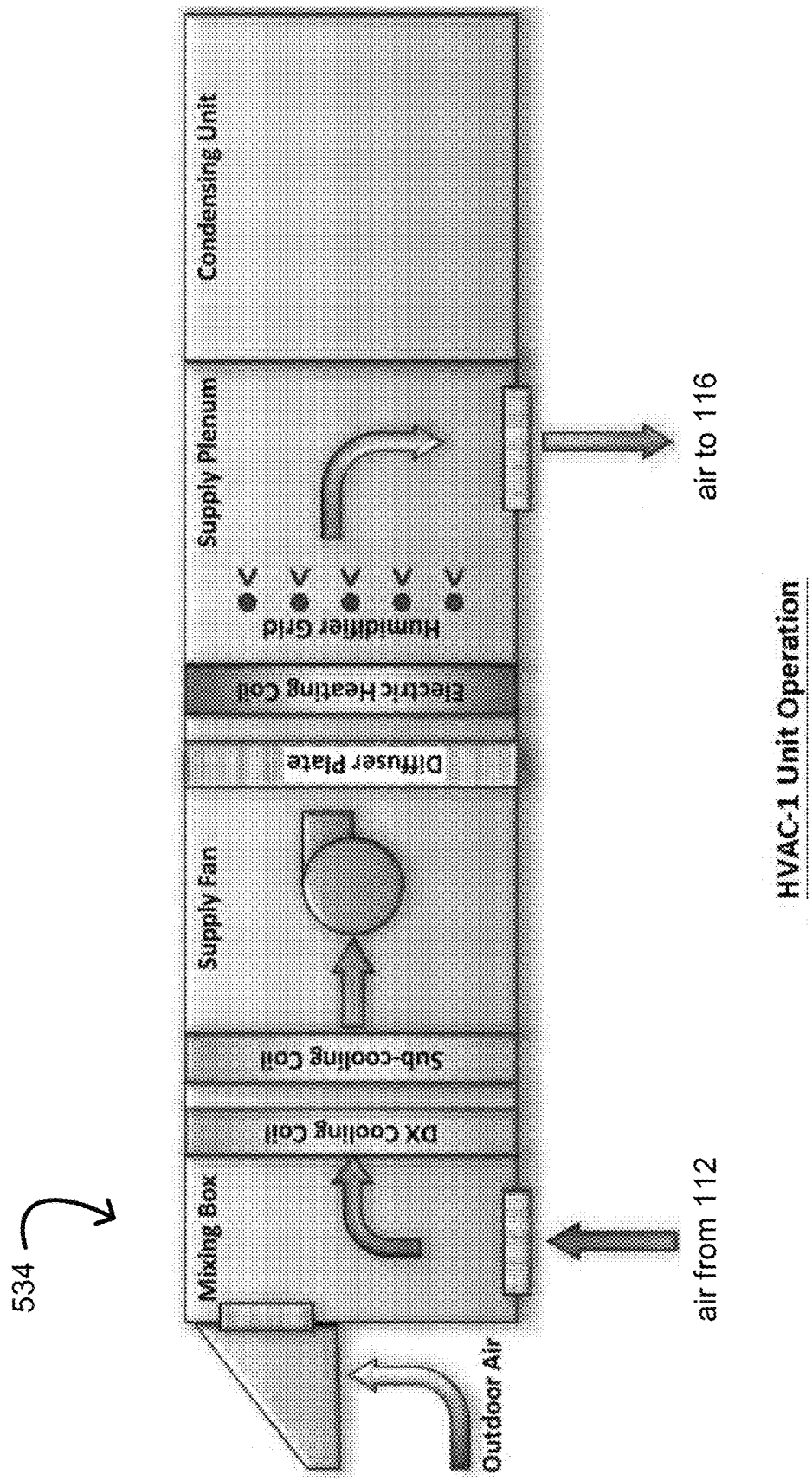

FIG. 8 illustrates an HVAC system of a modular datacenter facility in accordance with some embodiments.

Figure 9:
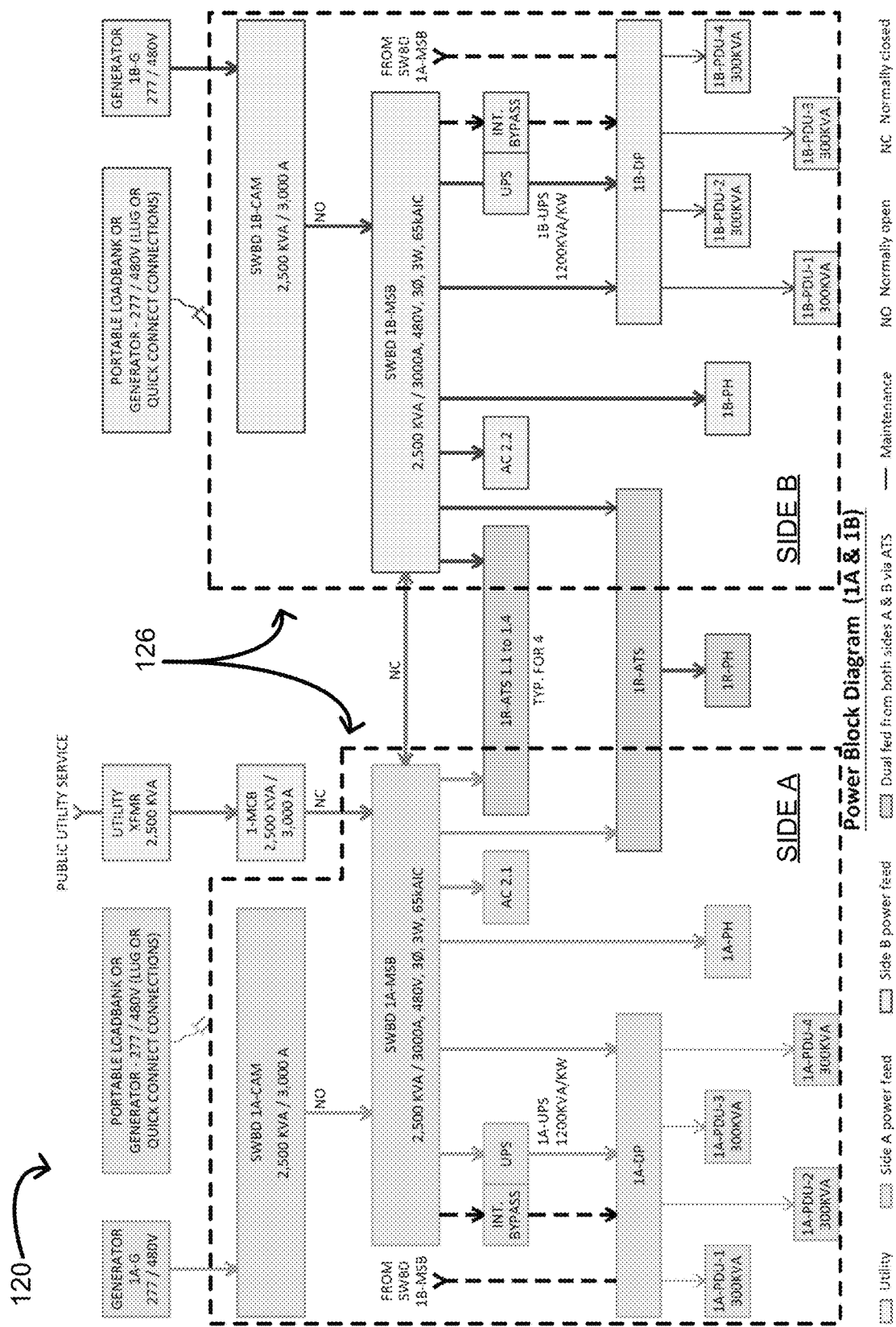

FIG. 9 illustrates a power-center building module of a modular datacenter facility in accordance with some embodiments.

Figure 10:
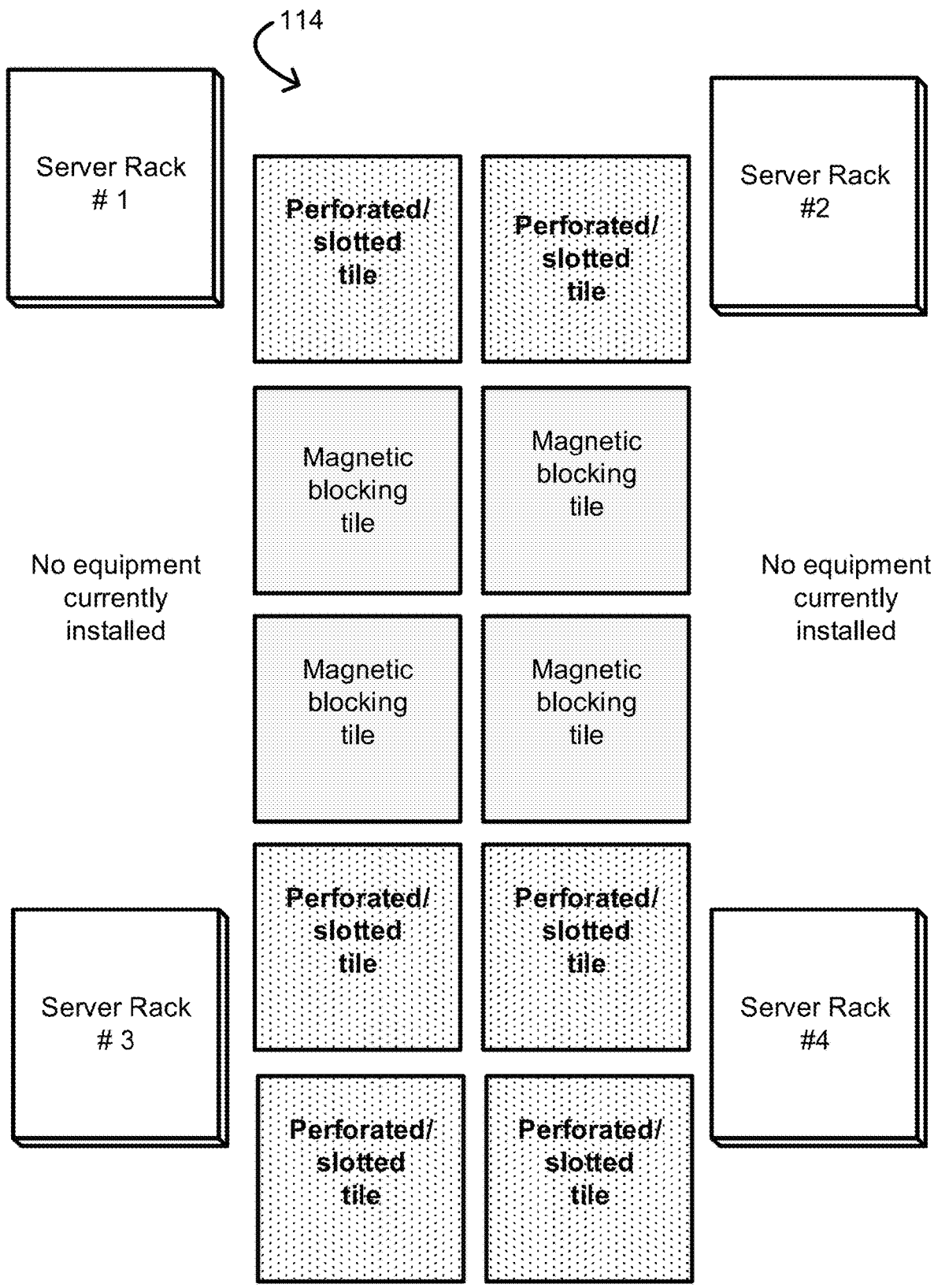

FIG. 10 illustrates a diagram of an embodiment of four magnetic blocking tiles placed on perforated tiles or open areas, in an area where electronic equipment, including various computing systems, is designed and planned to be located but currently is not installed.

Figure 11:
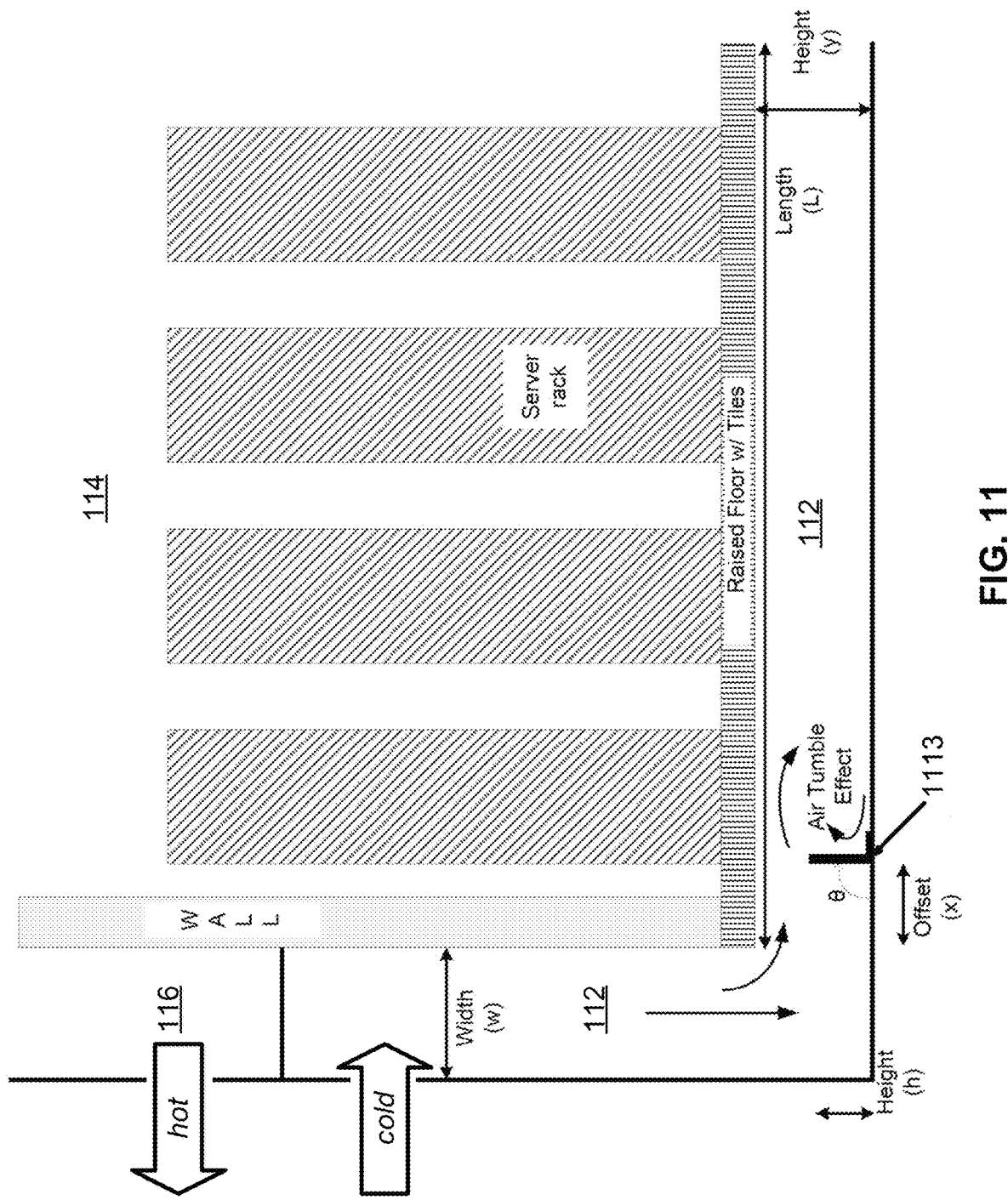

FIG. 11 illustrates a geometry of an air dam configured with respect to the data room, raised floor, and supply air plenum in accordance with some embodiments.

Figure 12:
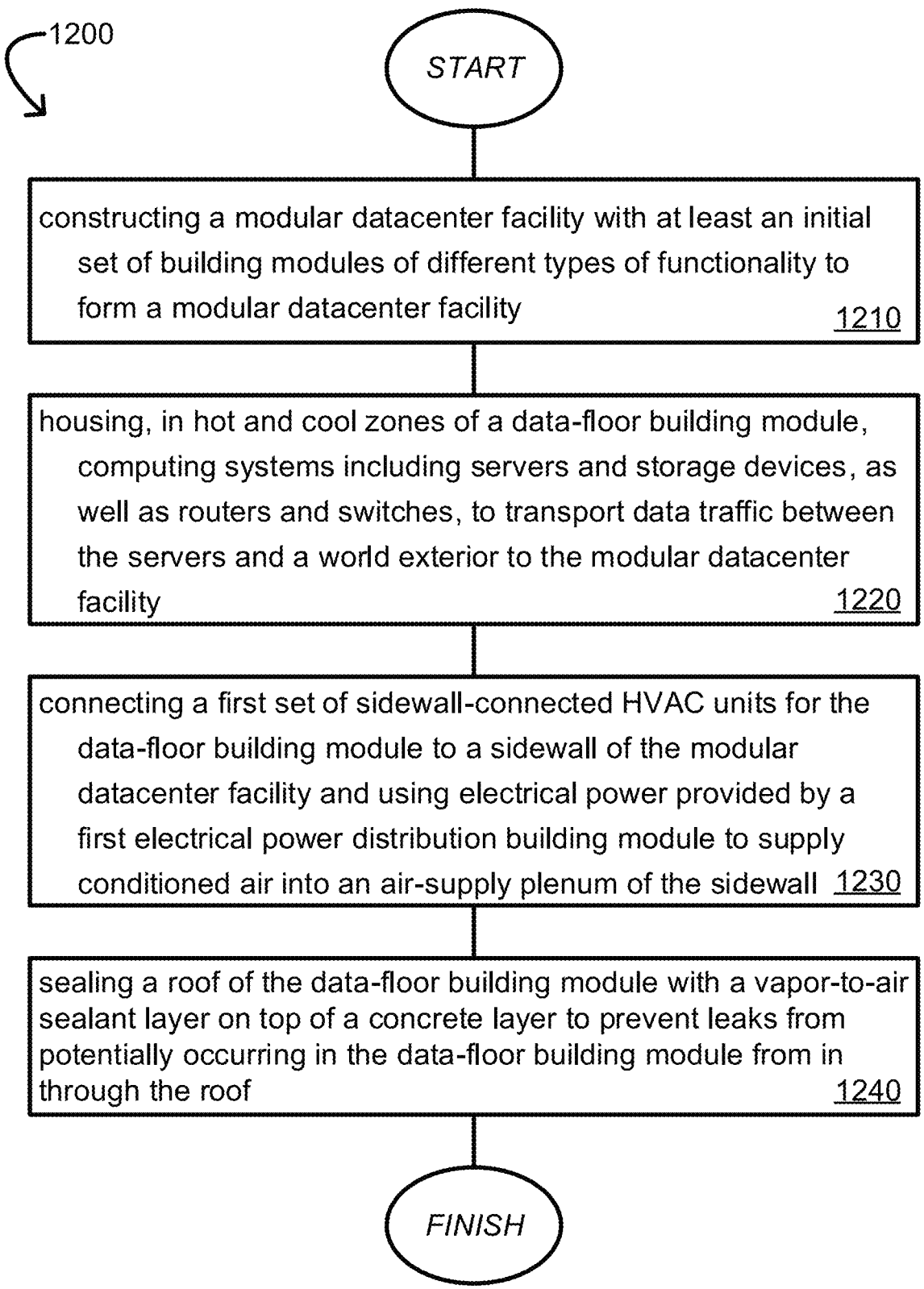

FIG. 12 illustrates a method of a modular datacenter facility in accordance with some embodiments.

While the design is subject to various modifications and alternative forms, specific embodiments thereof have been shown by way of example in the drawings and will herein be described in detail. The design should be understood to not be limited to the particular forms disclosed, but on the contrary, the intention is to cover all modifications, equivalents, and alternatives falling within the spirit and scope of the design.

DESCRIPTION

In the following description, numerous specific details are set forth, such as examples of specific heights and dimensions, named components, connections, types of offices, etc., in order to provide a thorough conceptual understanding. It will be apparent, however, to one skilled in the art that the invention provided herein can be practiced without these specific details. In other instances, well known components or methods have not been described in detail but rather in a block diagram in order to avoid unnecessarily obscuring the invention. Thus, the specific details set forth are merely examples. The specific details may be varied from and still be within the spirit and scope of the invention. Example processes for and apparatuses to manage cooling for a datacenter facility are described. The following drawings and text describe various example implementations of the design.

In general, a modular datacenter facility and a method thereof is provided in accordance with some embodiments. The module datacenter facility can be constructed with an initial set of building modules of different types of functionality. A first building module can be a data-floor building module. A first set of sidewall-connected HVAC units can connect to a sidewall of the modular datacenter facility and use electrical power provided by a first electrical power distribution building module to supply conditioned air into an air-supply plenum of the sidewall to cool computing systems housed in the data-floor building module. The first set of the sidewall-connected HVAC units allow for fewer penetrations in a roof of the data-floor building module, thereby minimizing an amount of leaks potentially occurring in the roof of the ceiling, and thereby minimizing risk of any damage to the computing systems.

A modular datacenter facility can have all instances of a particular type of building module with approximately the same floor plan and architectural design. An initial set of building modules can be built upon a parcel of land, and then as needs of space and additional capacity of the modular datacenter facility increase, then at a future point in time additional building modules of the different types can be rapidly added to the initial set of building modules. (See, for example, FIGS. 2A and 2B, in which additional building modules of the different types are added to an initial set of building modules (e.g., "Building 1") forming modular datacenter facilities 200A and 200B.) The building modules of the different types use one or more connecting corridors architected into at least a first type of building module and corresponding aligned doorways between both building modules to interconnect two building modules adjacent and abutted to each other.

Figure 1A:
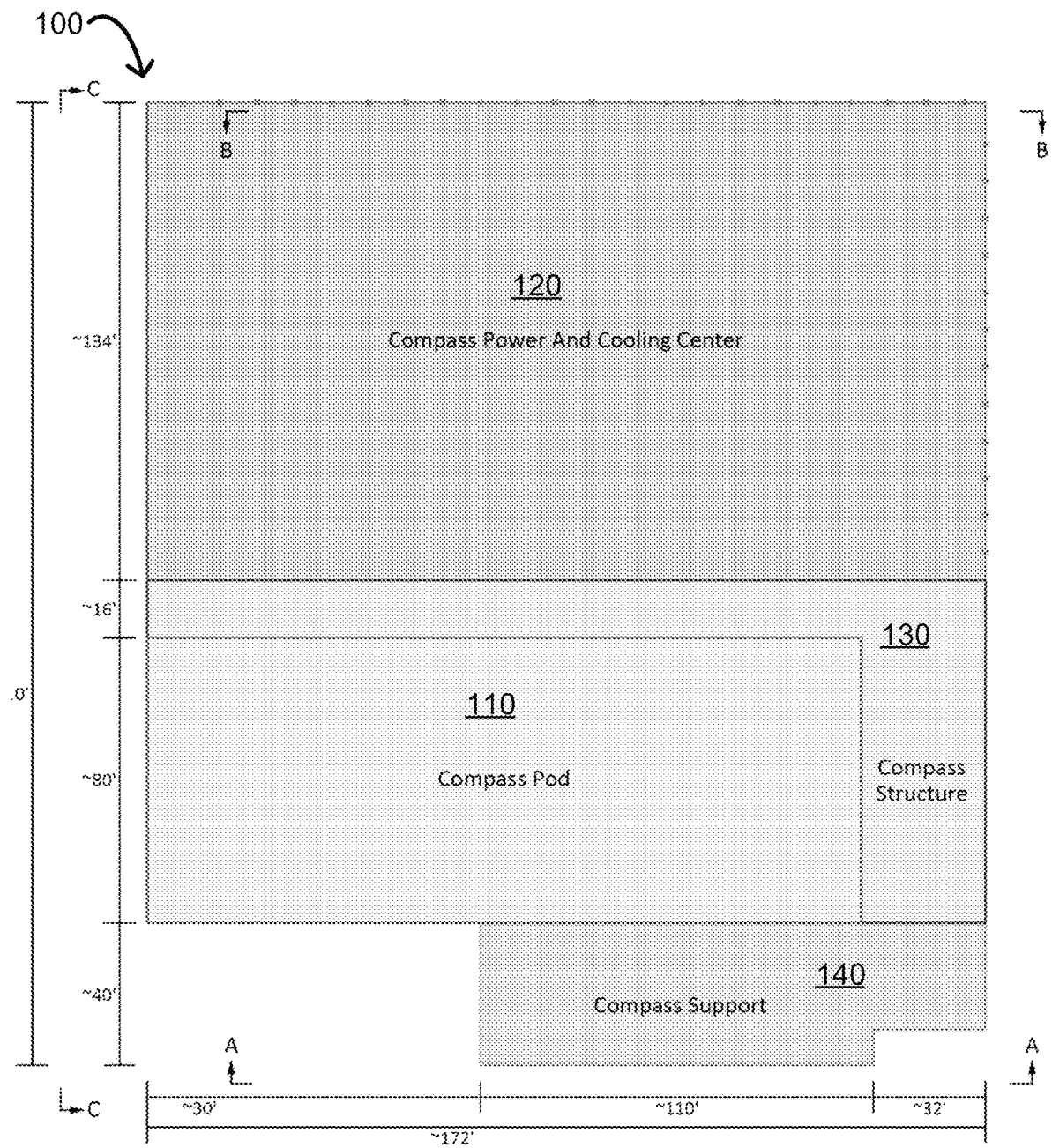
Figure 1B:
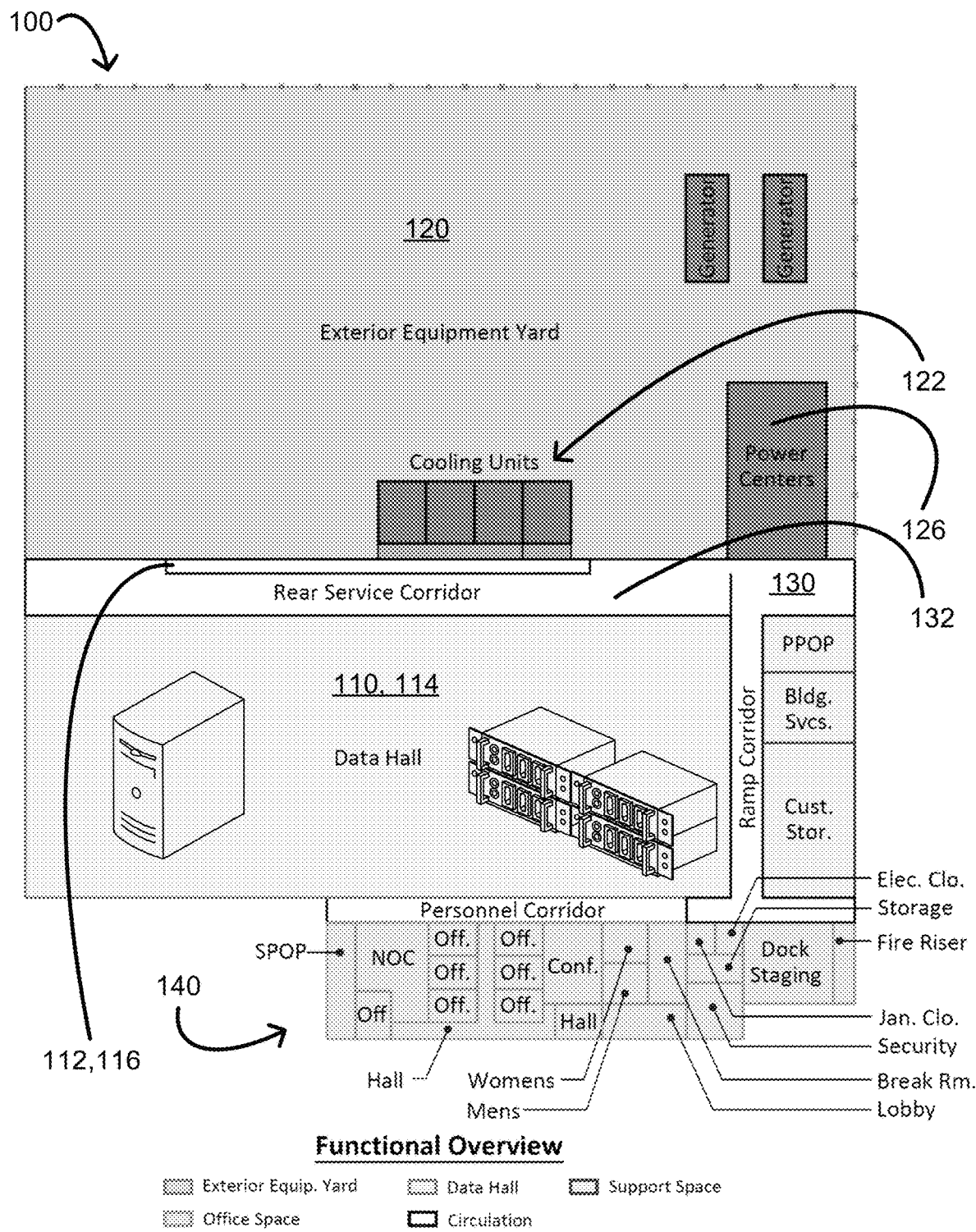
Figure 1C:
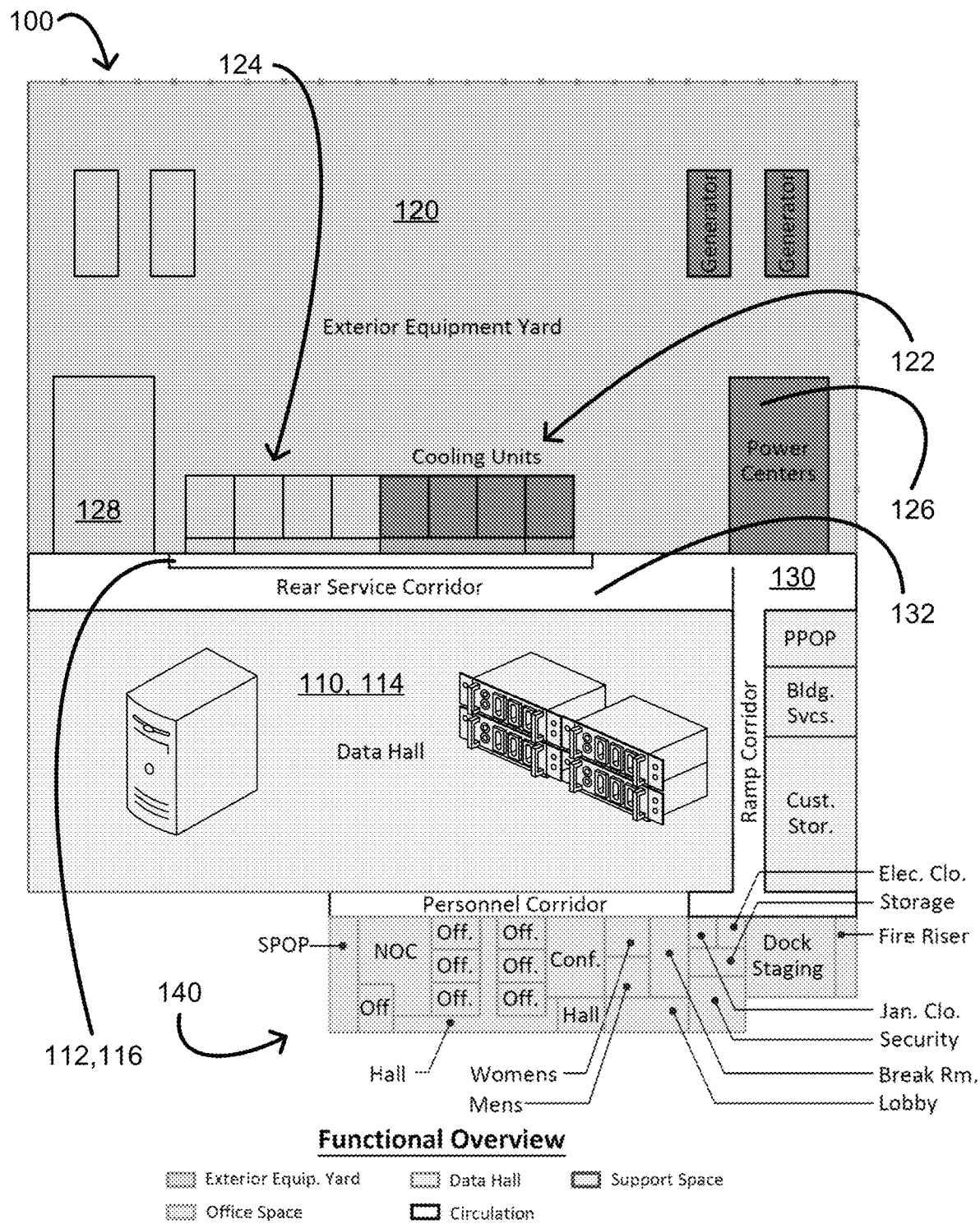

FIGS. 1A, 1B, and 1C illustrate block diagrams of embodiments of a modular datacenter facility 100 constructed with a set of building modules of different types of functionality to form the modular datacenter facility 100 having a standardized pre-approved architectural design and layout.

As shown, the modular datacenter facility 100 can be constructed with a modular organization. The modular datacenter facility 100 can be constructed with a set of building modules of different types of functionality to form or make up the modular datacenter facility 100 having a standardized pre-approved architectural design and layout. Each type of building module in the set has a specific collection of functionality associated with that type of building module. Each type of building module, such as a data-floor building module 110, a power-center building module 120, a facility-support building module 130, and an office-support building module 140, has a specific set of functionality associated with that building module. Each building module of the different types is a pre-engineered, standardized building block containing architectural features to allow easy configuration and integration with the other building modules that form the modular datacenter facility 100. All instances of a particular building module with that type of functionality will have approximately a same floor plan and architectural design. Small changes can be made to the interior of a given building modules design but in general, the floor plan and architectural design remain the same. Components making up each of the building modules 110, 120, 130, and 140 are prefabricated and shipped to the parcel of land.

The modular datacenter facility 100 can house computing systems in a data-floor building module 110. The computing systems includes servers and storage devices housed in hot and cool zones, as well as routers and switches that transport data traffic between the servers as well as transport traffic to a world exterior to the modular datacenter facility 100. The modular datacenter facility 100 also includes redundant or backup power supplies, redundant data communications connections, environmental cooling controls, and security devices.

The data-floor building module 110 is the principal module of the datacenter as it provides the hardened environment for the computing systems that includes the server room. The data-floor building module 110 can be approximately 10,000 square feet and works in unison with the power-center building module 120 to provide one MW of UPS power at a 2N redundancy. This power-center building module 120 is pre-fabricated off site and it includes everything in the design electrical system. Each power-center building module 120 includes Switchgear, an Uninterruptable Power Supply, Power Controls, and each power-center building module 120 is associated with a data-floor building module 110. The data-floor building module 110 structure also supports the N+1 mechanical system that features airside economization and delivers high-efficiency cooling via 2 air chases along the walls of the data-floor building module, the main datacenter, and a 36-inch raised floor system.

The data-floor building module 110 is the heart of the datacenter environment as it contains the computing systems. The data-floor building module 110 supports racks of servers having densities varying in power consumption from 2 kW to 20 kW without containment walls between the racks of servers of varying power consumption density.

The data-hall building module 110 (e.g., the data-hall building module 110 of the initial set of the building modules) can include a steel-based joist or concrete beam that horizontally connects two parallel sections of wall of the data-hall building module 110 to eliminate a need for support columns on a raised floor of the data-hall building module 110 for supporting the computing systems and the other electronic components. For example, the data-floor building module 110 can have a multitude of 80' steel joists horizontally connecting parallel sections of wall of the building module to eliminate a need for support columns being located on the 10,000 square feet of raised 36-inch floor that supports the computing systems. The steel-based joist or concrete beam can create an open floor space and ensure that users of the data-floor building module 110 have a sufficient degree of flexibility to accommodate a number of server-rack configurations for racks of the servers having varying power consumption densities in the hot and the cool zones of the data-hall building module 110. The raised floor houses the computing systems and other electronic components as well as creates a single, under-floor plenum configured for supplying the conditioned air under the raised floor to an interior of the data-hall building module and returning heated air to a return plenum or return ducts in a ceiling above the data-floor building module for return of the heated air to the first set of sidewall-connected HVAC units. In some embodiments, the raised floor is a 36-inch floor that houses the computing systems as well as creates a dual plenum for air supply with cooling supply air being supplied underneath the raised floor as well as a ceiling plenum for hot air return.

The data-floor building module 110 containing the computing systems can be connected to a grade-mounted cooling system or HVAC units 122 powered by power center 126 that features airside economization. In an example embodiment, the data-floor building module 110 uses packaged air handlers to control the air temperature and moisture of the data floor environment. As shown in FIG. 1C, the cooling capacity of at least a first set of the grade-mounted HVAC units 122 can be doubled by doubling the number of air-handler units (e.g., adding a second set of grade-mounted HVAC units 124) and adding an additional power center such as power center 128.

The building modules of the different types 110, 120, 130, and 140 use one or more connecting corridors architected into at least a first type of building module such as a rear service corridor 132 of the facility-support building module 130, and corresponding aligned doorways between any two of such building modules can interconnect the two building modules adjacent and abutted to each other.

Figure 2A:
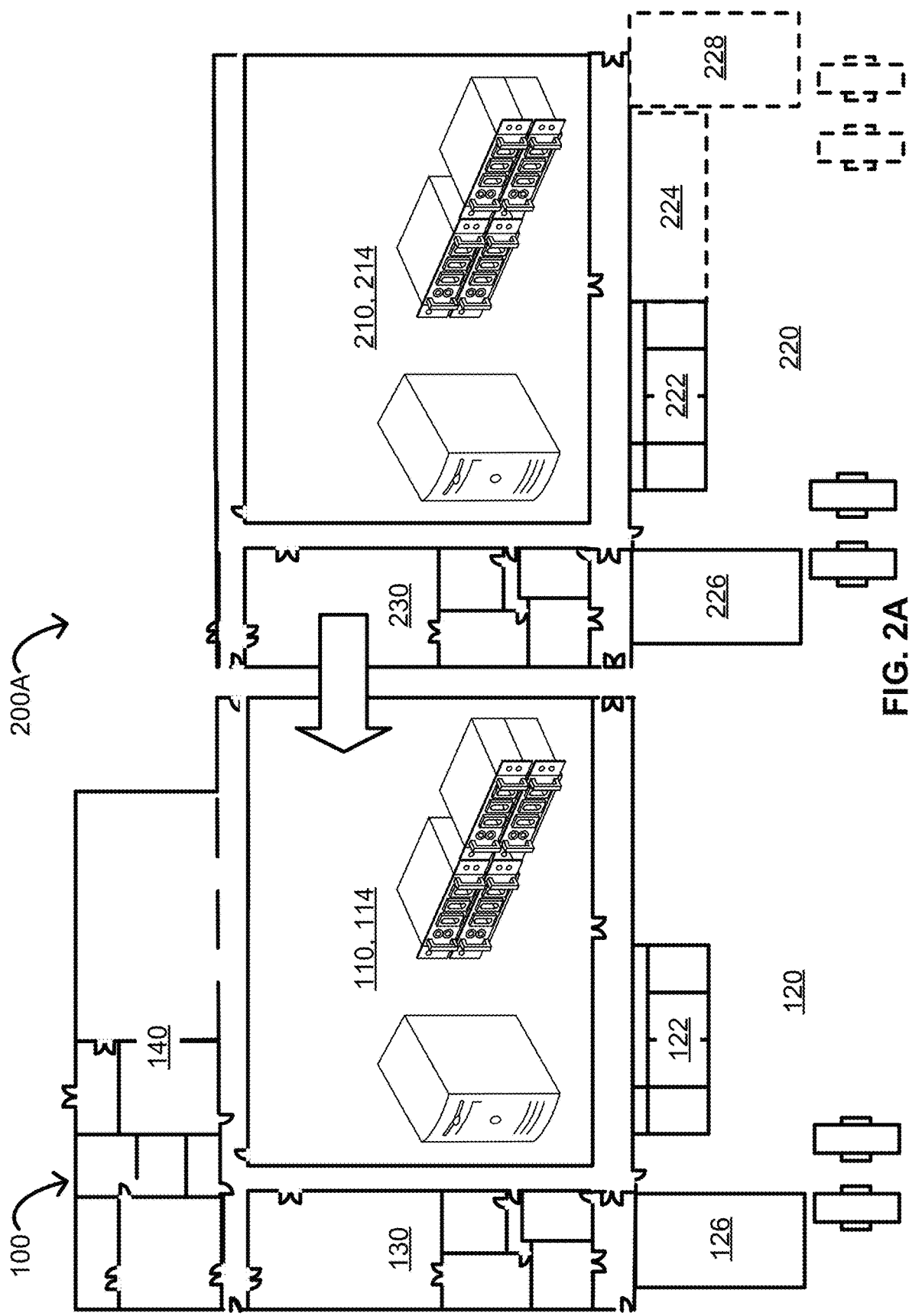
FIG. 2A illustrates expansion of a modular datacenter facility in accordance with some embodiments.

FIG. 2A illustrates a block diagram of an embodiment of a physical composition and geographic arrangement of building modules matched to a current capacity and space needs of a user of a modular datacenter facility 200A as well as to a geography of a parcel of land that the modular datacenter facility 200A.

An example 1-MW datacenter facility (e.g., the modular datacenter facility 100) with all four building modules (e.g., the building modules of the different types 110, 120, 130, and 140) can be expanded to a 2-MW datacenter facility with the addition of another data-floor building module 210 having data floor 214, a power-center building module 220, a facility-support building module 230, and an optional office-support building module 240 (not shown). A hardened-structure building module such as the hardened-structure building module 350 described herein can further be added. The power-center building module 220 can include a power center 226 to power at least the data-floor building module 210 and a first set of HVAC units 222 to control the air temperature of the data floor 214. The cooling capacity of the first set of HVAC units 222 can be at least doubled by doubling the number of air handlers to include a second set of HVAC units 224 and adding additional power via at least an additional power center 228. In some embodiments, the power-center building module 220 has one generator and the swing generator of the first instance of the power-center building module (e.g., the power-center building module 120) is electrically coupled to supply backup power to either set of building modules.

The building connecting methodology via a connecting corridor makes datacenter expansion simple. Each step of expansion consisting of adding another data-floor building module, a power-center building module, a facility-support building module, an optional office-support building module, and a hardened-structure building module includes building adjacent an existing module with connections via the service corridor (e.g., the service corridor 132) and a personnel corridor. Conduits may be run diversely down the service and personnel corridors for network connectivity. A major advantage of this model is you are never constructing in the same building footprint as your original datacenter facility. A 1-MW modular datacenter facility site can expand to, for example, a 4-MW modular datacenter facility by adding three additional sets of building modules. The number of sets of building modules making up the modular datacenter depends on the size of the parcel of land (more land=more datacenters).

Both a physical composition and geographic arrangement of a first configuration of building modules in the initial set can be different than a second configuration of building modules in the initial set; thus, the set of building modules can be matched to a current capacity and space needs of a user of the modular datacenter facility as well as to a geography of the parcel of land that the modular datacenter facility will be located on. Each expansion set of building modules can be built adjacent an existing one with connections via the service corridor and the personnel corridor.

Aligned doors for the connecting corridors may be walled off or sealed off to become part of a permanent wall when the interconnection point is desired to be removed for security or other purposes. The aligned doors can be configured to swing in an opposite direction of the building module they are connecting to in order to allow easier access between the distinctly different building modules abutted together, which are also then interconnected, via a flange, a link, or other interconnection mechanism, to each other to form a single modular datacenter facility. Each building type includes the interconnection mechanism to optional component additions of additional building modules. The aligned doors connecting to another building module typically also have key card access readers installed to control operation of that doors locking mechanism.

In an embodiment, at least one of 1) electrical fiber conduits and 2) network fiber conduits are run diversely down the connecting corridors for network connectivity between adjacent building modules to facilitate interconnecting two building modules adjacent and abutted to each other. Alternatively, the modular datacenter facility may use the outside plant conduit infrastructure for electrical or network connectivity.

In instances where multiple customers use the datacenter facility, while the building modules abut each other, neither building module may have access to the other building module, as the connecting corridors would be walled off. However, if it is merely the same client expanding, then the connecting fiber conduits and service corridors makes the two constructed building modules one larger extended module.

Figure 2B:
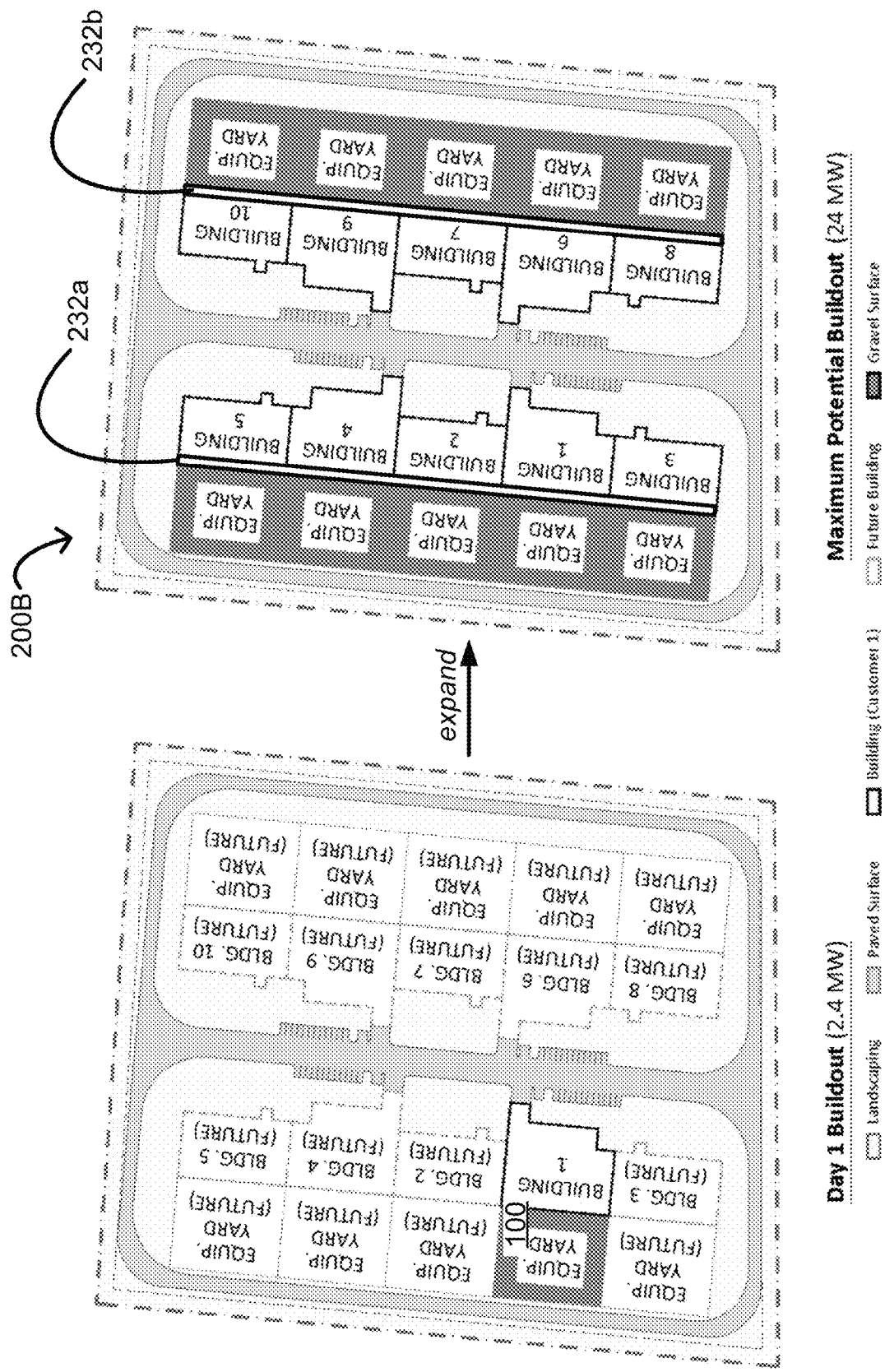
FIG. 2B illustrates expansion of a modular datacenter facility in accordance with some embodiments.

FIG. 2B illustrates an expansion of the modular datacenter facility 100 in accordance with some embodiments.

Initially, all four types of building modules 110, 120, 130, and 140 can be built onto a given geographic plot of land providing, for example, "Building 1" and an associated equipment yard as shown in FIG. 2B forming at least the modular datacenter 100 (e.g., a 2.4-MW modular datacenter facility). At a later or future point in time, the expansion can occur, as described, thereby forming the modular datacenter facility 200A (e.g., now a 4.8-MW modular datacenter facility) in an expanded form. At a number of later or future points in time, expansion can further occur, thereby forming the modular datacenter facility 200B (e.g., now a 24-MW modular datacenter facility) in the expanded form. This occurs by adding different building module types to support one or more new or existing customers on the same existing parcel of land or expand for a current customer. In general, the expansion 200B can share one or more of the previously fabricated and installed building module types 110, 120, 130, and 140 or build its own instance of that building module type. When shared, each rear service corridor of each facility-support building module 130 can connect forming one or more shared rear service corridors for the expansion such as the shared rear service corridors 232a and 232b. Doorways between the building modules of the different types can interconnect at least two building modules adjacent and abutted to each other.

FIG. 3 illustrates a hardened-structure building module 350 of the modular datacenter facility 100 in accordance with some embodiments.

The initial datacenter built in a parcel of land (e.g., "Building 1" of FIG. 2B) can include the set of four building modules of different types of functionality: the data-floor building module 110; the power-center building module 120; the facility-support building module 130; and the office-support building module 140. The hardened-structure building module 350 can support the building integrity structure of the modular datacenter facility 100.

The building module types 110, 120, 130, and 140, as well as the hardened-structure building module 350 make up various embodiments of the modular datacenter facility 100, which can be approximately 20,680 square feet in some embodiments. The modular datacenter consists of the above modules connected together, working in unison. This module synergy provides a unique facility layout that results in a highly efficient datacenter.

Each building module type in the set of building modules of different types of functionality can be architected and formed as a totally separated building that is interconnected to another building module via aligned doors between these building modules and the connecting corridor 232 1) behind the data floor containing the servers and storage devices housed in hot and cool zones in a data-floor building module 110 and 2) in front of the power center building module 120, which connecting corridor 232 can be considered part of the office-support building module 130.

Service corridors such as the service corridor 132, as well as personnel corridors, can run a length of at least some of the initial set of building modules connected in the modular datacenter facility 100. Such corridors can further run a length of at least some of a subsequent set of building modules connected in a modular datacenter facility (e.g., the service corridors 232a and 232b of the modular datacenter facility 200). Likewise, a hardened-structure building module of the subsequent set of building modules can include a hardened shell and one or more service or personnel corridors between a first instance of the hardened-structure building module and a second instance of the hardened-structure building module connecting to and abutting the first instance of the hardened-structure building module. The one or more service or personnel corridors can be laid out between an interior wall and an exterior wall of the hardened-structure building module forming the hardened shell of the hardened-structure building module.

Roof

Figure 4A:
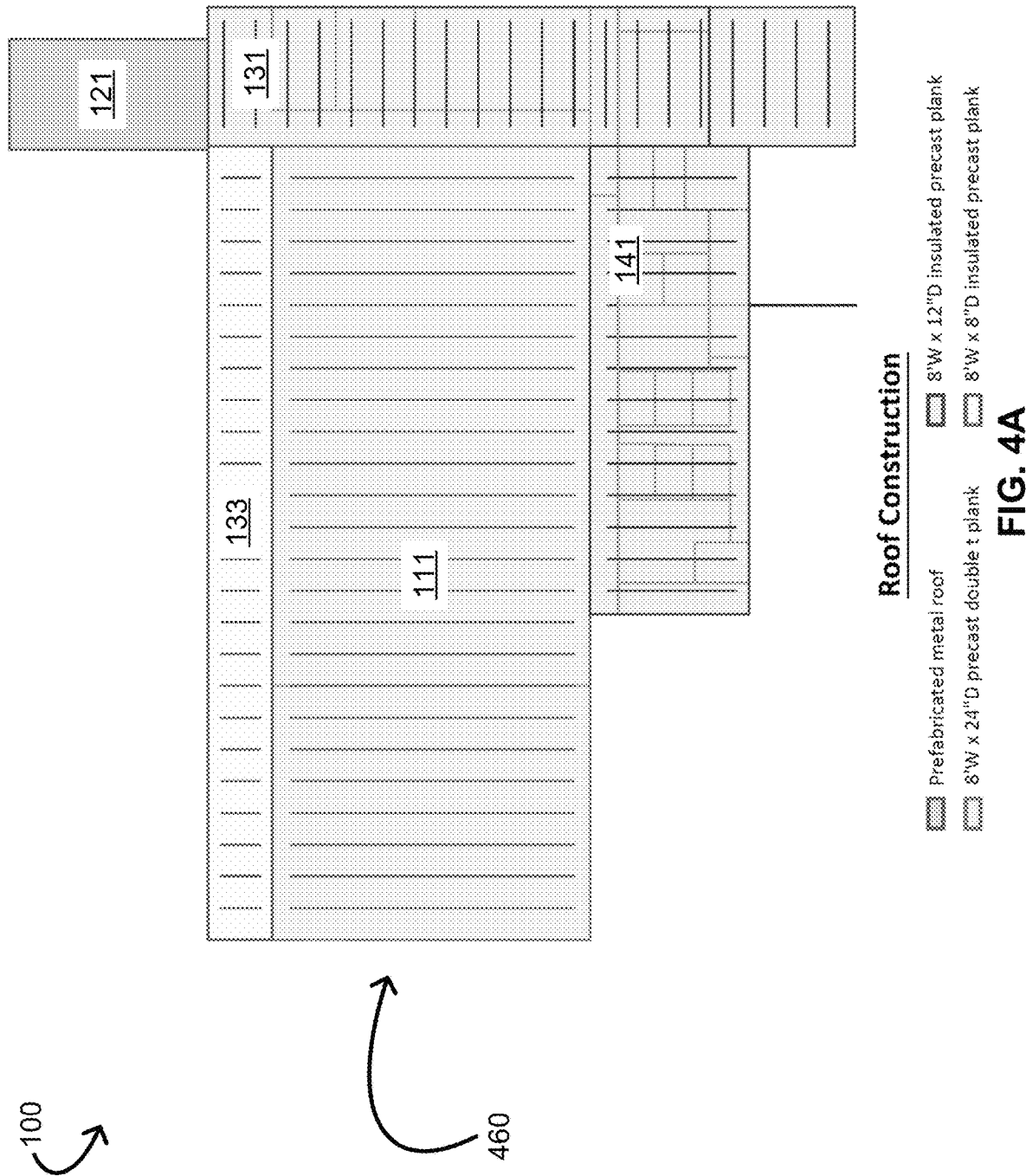
FIG. 4A illustrates a roofing system of a modular datacenter facility in accordance with some embodiments.

FIG. 4A illustrates a roofing system 460 of the modular datacenter facility 100 in accordance with some embodiments.

Each building module type in the set of building modules of different types of functionality can have one or more types of roof over the building module or at least a portion of the building module, and the roofs, together, can form the roofing system 460. As shown, the data-floor building module 110 can have a roof 111; the power-center building module 120 can have a roof 121; the facility-support building module 130 can have a first roof 131 and a second roof 133; and the office-support building module 140 can have a roof 141.

Each building module type in the set of building modules of different types of functionality can have a same or different roof as one or more of the other building modules. For example, as shown in FIG. 4A, the first roof 131 of the facility-support building module 130 can be the same as the first roof 141 of the office-support building module 140, which roofs 131 and 141 can be different than the roof 111 of the data-floor building module 110, the roof 121 of the power-center building module 120, and the second roof 133 of the facility-support building module 130.

In some embodiments, one or more of the roofs are precast planks (e.g. precast concrete planks). For example, each roof of the roof 111 of the data-floor building module 110, the roofs 131 and 133 of the 131 the facility-support building module 130, and the roof 141 of the office-support building module 140 can be precast planks. The roof 111 of the data-floor building module 110 can be a precast double-tee plank.

In some embodiments, on or more of the roofs are prefabricated metal roofs. For example, the roof 121 of the power-center building module 120 can be a prefabricated metal roof.

FIG. 4B illustrates layers of a roof of the roofing system of the modular datacenter facility 100 in accordance with some embodiments.

Any one or more of the roofs can have a multilayer construction. As shown in FIG. 4B, the precast-plank roofs can have a multilayer construction in which the precast roof plank is covered by a vapor-to-air sealant layer, which vapor-to-air sealant layer, in turn, is covered by one or more layers of insulation, a cover board, and a feltback membrane. From a top of the foregoing roof down to the precast plank, the multilayer construction of the roof can include the feltback membrane over the cover board, the cover board over the one or more layers of insulation, the insulation over the vapor-to-sealant layer, and vapor-to-sealant layer over the precast plank. The vapor-to-air sealant layer over or on top of the precast plank or concrete layer can further prevent leaks from potentially occurring in the data-floor building module from in through the roof.

Sidewall-Connected HVAC Systems

FIG. 5 illustrates an HVAC system of the modular datacenter facility 100 in accordance with some embodiments.

As shown, the HVAC system of the modular datacenter facility 100 can include the grade-mounted cooling system 122, a roof-mounted HVAC system 534 on the roof 131 of the facility-support building module 130 (not the roof 133 above the rear-service corridor 132 of the facility-support building module 130 or the roof 111 of the data-hall building module 110), and a number of additional, optionally roof-mounted cooling systems for comfort cooling of the modular datacenter facility 100 such as for cooling the power-center building module 120, the facility-support building module 130, and the office-support building module 140.

The data-floor building module 110 can use the grade-mounted cooling system or the first set of HVAC units 122 to control the air temperature of the data floor environment. Again, as shown in FIG. 1C, the cooling capacity of the first set of HVAC units 122 can be at least doubled by at least doubling the number of air handlers and adding additional power via at least an additional power center such as the power center 128 of the power-center building module 120.

As described in more detail with reference to FIGS. 6A, 6B, and 6C, the first set of grade-mounted HVAC units 122 for the data-floor building module 110 can connect to a sidewall of the modular datacenter facility 100 and use electrical power provided by a first electrical power distribution building module such as the power center 126 of the power-center building module 120 to supply conditioned air into an air-supply plenum of the sidewall (e.g., an air-supply plenum 112). The sidewall can be a sidewall of the data-floor building module 100 or a sidewall of a service corridor such as the service corridor 132. The first set of the sidewall-connected HVAC units 122 connecting to the sidewall allow for fewer penetrations in the roof 111 of the data-floor building module 110, thereby minimizing an amount of leaks potentially occurring in the roof 111 or a ceiling thereunder, and thereby minimizing risk of any damage to the computing systems and the other electronic components housed in the data-floor building module 110 from the leaks.

The supply of conditioned air into an air-supply plenum of the sidewall (e.g., the air-supply plenum 112) can cool the computing systems including the servers, storage devices, routers, and switches, and other electronic components housed in the data-floor building module 110 of the modular datacenter facility 100. As such, the first set of the sidewall-connected HVAC units allows for cooling of the computing systems and the other electronic components allowing for more server units to consume electrical power during their operation inside the data-floor building module without raising a temperature in the data-floor building module high enough to overheat the computing systems and the other electronic components. The HVAC units 122 can be connected in parallel via the supply plenum to cool 100% of a critical IT load.

Controls for the HVAC units 122 allow an operator to manually vary the air temperature set point of cooling air supplied by the HVAC units 122. The set point can be varied from 65° F. to 75° F. while still maintaining the American Society of Heating, Refrigerating, and Air-Conditioning Engineers ("ASHRAE") recommended temperature envelope. The temperature envelope can be difficult to maintain if the supply air temperature set point from an air-return plenum is outside, for example, a 75° F. to 99° F. range. Controls for the HVAC units 122 such as raised-floor differential-static pressure controls also allow an operator to vary the air-flow rate and volume of cooling air supplied by the HVAC units 122 to maintain an underfloor, static pressure set point.

The HVAC units 122 are configured such that the HVAC units 122 provide sensible cooling via indirect airside economizers without a dehumidification means. The capacity to dehumidify a humidity load, for example, caused by a rapid weather change, can be handled by the roof-mounted HVAC system 534, which cooperates with the HVAC units 122 of the data-floor building module 110 to maintain a positive pressure in the data-hall building module 120.

With respect to the roof-mounted HVAC system 534 on the roof 131 of the facility-support building module 130, the HVAC system 534 can be configured to handle ventilation (introduction of outside air), temperature variation, pressurization, dehumidification, humidification, whereas the HVAC units 122 are primarily configured to handle temperature variation and pressurization.

FIGS. 6A, 6B, and 6C illustrate air flow through the data-floor building module 110 of the modular datacenter facility 100 in accordance with some embodiments.

As shown, the grade-mounted HVAC units 122 can supply the conditioned air to a data floor 114 of the data-floor building module 110 through the air-supply plenum 112 including a sidewall of the modular datacenter facility 100 (e.g., the sidewall of the of the facility-support building module 130) and raised-floor cavity under the raised floor of the data-floor building module 110. The conditioned air from the air-supply plenum 112 can then diffuse through perforated tiles or the like of the raised floor to cool the computing systems and the other electronic components. Heated air resulting from cooling the computing systems and the other electronic components can then diffuse through air grilles or the like of a ceiling above the data floor 114. The grade-mounted HVAC units 122 can accept the return or heated air from the data floor 114 of the data-floor building module 110 through an air-return plenum 116 including a ceiling cavity above the data floor 114 of the data-floor building module 110 and the sidewall of the modular datacenter facility 100 (e.g., the sidewall of the of the facility-support building module 130).

In view of the foregoing, an air channel, including any of a duct, a plenum, and a combination of one or more ducts and plenums, begins an air-flow path of the conditioned air at the first set of the sidewall-connected HVAC units 122, through the air-supply plenum 112 of the sidewall, through an under-floor plenum portion of the air-supply plenum 112 positioned under a raised floor of the data-floor building module, through the raised floor of the data-floor building module 110, through one or more perforated tiles covering the raised floor, and into an interior 114 of the data-floor building module 110 for the cooling of the computing systems and the other electronic components housed in the data-floor building module. The air channel air-flow path of the conditioned air continues from the interior 114 of the data-floor building module 110, through a ceiling of the of the data-floor building module, where one or more return ducts above the ceiling route heated air in the air-return plenum 116 from above the data-floor building module 110 down along the sidewall and back to an air intake of the first set of the sidewall-connected HVAC units 112. The first set of the sidewall-connected HVAC units can subsequently remove heat from the heated air to provide the conditioned air for recirculation of the conditioned air through the air channel, including through the air-supply plenum 112 of the sidewall, through the under-floor plenum thereof, and through the raised floor of the data-floor building module 110 for the cooling of the computing systems and the other electronic components.

The air-supply plenum 112 and an air-return plenum 116 of the sidewall of the modular datacenter facility 100 are constructed with a pre-approved architectural design and layout for adding additional sidewall-connected HVAC units 122 at a later date from initial construction of the modular datacenter facility 100 with the initial set of building modules of the different types of functionality.

Adverting to FIG. 6C, FIG. 6C diagrammatically illustrates supply of the conditioned air to the data floor 114 and return of the heated air to the HVAC units 122 in accordance with some embodiments. As shown, the HVAC units 122 can supply the conditioned air to the air-supply plenum 112 at a rate of approximately 20,000-314,500 cubic feet per minute ("CFM") and a temperature of approximately 65-75° F. The conditioned air from the air-supply plenum 112 can then diffuse through the perforated tiles or the like of the raised floor of the data-floor building module 110 at a rate of approximately 4,000-314,500 CFM and a temperature of approximately 65-75° F. Cooling the computing systems and the other electronic components can increase the temperature of the conditioned air from 65-75° F. to 65-99° F. depending upon the temperature of the IT load. The heated air can then diffuse through the air grilles or the like of the ceiling of the data-floor building module 110 at a rate of approximately 4,000-314,500 CFM. Simultaneously with the foregoing, the HVAC system 534 can draw outside air or makeup air from outside the modular datacenter facility 100 and mix it with some of the conditioned air from the air-supply plenum 112, thereby diluting the outside air with already conditioned air for more efficient modification of the outside air with respect to temperature, humidity, and pollution such as particulate matter. In drawing the air into the HVAC system 534, the outside air can be drawn at a rate of approximately 0-1500 CFM and the conditioned air can be drawn from the air-supply plenum 112 at a rate of approximately 6000-7500 CFM. Upon mixing the outside air (e.g., approximately 23-111° F.) and the conditioned air (e.g., approximately 65-75° F.) and subsequently modifying the resulting air mixture with respect to temperature, humidity, and pollution, the HVAC system 534 can supply the air mixture with the makeup air to the air-return plenum 116 at a rate of approximately 7,500 CFM and a temperature of approximately 45-99° F. where air mixture can further mix with the heated air from cooling the computing systems and the other electronic components. The HVAC units 122 can subsequently draw the air mixture including the makeup air from the air-return plenum 116 for heat exchanger-based cooling and reintroduction of the conditioned air to the air-supply plenum 112 to cool the IT load and maintain at least a slight positive pressure compared to ambient pressure.

Arranging computer racks in hot and cold aisles focuses cold air delivery at the front intake of a rack and expels hot air at the back. Rack rows are arranged so the backs of rows face each other and hot air is collected above the row by a ceiling plenum (e.g., the air-return plenum 116), which returns the air to the HVAC unit directly. The fronts of the racks face each other in a row that has vented tiles in the raised floor to deliver cold air to the rack fronts from the HVAC units.

FIG. 7 illustrates heat exchange-based cooling of HVAC units 122 in accordance with some embodiments.

As shown, the HVAC units 122 are configured such that the HVAC units 122 provide sensible heat exchange-based cooling via indirect airside economizers. In operation, heated air (e.g., approximately 65-99° F.) from cooling the computing systems and the other electronic components can be drawn from the air-return plenum 116 into a top portion of one of the HVAC units 122 where the heated air first comes in contact with the heat exchanger (e.g., plate heat exchanger). On the other side of the heat exchanger, outside air can be drawn into a bottom portion of the same one of the HVAC units 122 where the outside air first comes in contact with the heat exchanger. The heated air and the outside air can flow in opposite directions across opposites sides of the heat exchanger, during which a continuous thermal equilibrium process can cool the heated air and warm the outside air.

In view of the foregoing, the first set of the sidewall-connected HVAC units 122 are configured with heat exchangers (rather than louvers) to remove heat from recirculating conditioned air inside the data-floor building module 110 without introducing air from outside the data-floor building module 110, thereby preventing outside air with humidity and potential pollution from mixing with the recirculating conditioned air inside the data-floor building module 110, and thereby minimizing damage to the computing systems and the other electronic components housed in the data-floor building module 110.

The HVAC units 122 are configured to provide the sensible heat exchange-based cooling without a dehumidification means. The dehumidification means is not needed in the HVAC units 122 as the outside air used to cool the heated air never mixes. The capacity to dehumidify a humidity load, for example, caused by a rapid weather change, can be handled by the roof-mounted HVAC system 534, which cooperates with the HVAC units 122 of the data-floor building module 110 to provide dehumidified and pollutant-free makeup air, as well as maintain a positive pressure in the data-hall building module 120.

The first set of the sidewall-connected HVAC units 122 are configured to allow the first set of the sidewall-connected HVAC units 122 to be installed during a first time period of the data-floor building module 100 to cool the computing systems and the other electronic components housed in the data-floor building module 100 during the first time period. At a second, later time period of the data-floor building module 100, the first set of the sidewall-connected HVAC units 122 are configured to allow a second set of the sidewall-connected HVAC units (e.g., the second set of the sidewall-connected HVAC units 124 of FIG. 1C) to be proximately installed and connected into the air-supply plenum 112 and the air-return plenum 116 of the sidewall to cool the computing systems and the other electronic components housed in the data-floor building module during 100 the second time period of the data-floor building module 100.

The second set of the sidewall-connected HVAC units 124 can be installed with the pre-approved architectural design and layout selected from the group consisting of i) horizontally along the sidewall of the modular datacenter facility 100 in line with the first set of the sidewall-connected HVAC units 122; ii) vertically up the sidewall of the modular datacenter facility 100 in a configuration on top of the first set of the sidewall-connected HVAC units 122; and iii) a combination of horizontally along the sidewall of the modular datacenter facility 100 and vertically up the sidewall of the modular datacenter facility 100 in the configuration on top of the first set of sidewall-connected HVAC units 122. Horizontally along the sidewall of the modular datacenter facility 100 is exemplified in FIGS. 1C and 2A by adjacently placed HVAC units 122 and 124 and HVAC units 222 and 224, respectively. Vertically up the sidewall of the modular datacenter facility 100 includes, for example, stacking the HVAC units 122 and 124.

FIG. 8 illustrates the HVAC system 534 of the modular datacenter facility 100 in accordance with some embodiments.

The HVAC system 534 can be a rooftop unit configured to deliver up to at least 5,000 CFM with a maximum of 15,000 CFM of outdoor air. As shown in FIG. 6B, one or more air supply ducts enable the HVAC system 534 to draw conditioned air from the air-supply plenum 112, though, in some embodiments, the HVAC system 534 can alternatively draw heated air from the air-return plenum 116 or both the conditioned air from the air-supply plenum 112 and the heated air from the air-return plenum 116. In addition, the HVAC system 534 can draw outside air or makeup air from outside the modular datacenter facility 100 to make up for losses in the recirculated conditioned air. The outside air can be mixed with some of the conditioned air from the air-supply plenum 112, heated air from the air-return plenum 116, or both, thereby diluting the outside air with already conditioned air for more efficient modification of the outside air with respect to temperature, humidity, and pollution such as particulate matter. As such the HVAC system 534 can include a humidity-control system and a pollution-control system configured to control the humidity and the potential pollution of the makeup air that enters the modular datacenter facility for the losses in the recirculated conditioned air.

As shown in FIG. 8, the outside air can first mix with the conditioned air in a mixing box of the HVAC system 534 to form an air mixture. The air mixture can subsequently be passed through a direct expansion (DX) cooling coil and a sub-cooling coil for cooling (if needed). The HVAC system 534 can include a refrigerant reheat (sub-cooling) coil to improve the efficient of the system. A supply fan downstream of the cooling coils can push the cooled air mixture through a diffuser plate, an electric heating coil for heating (if needed), and a humidifier grid for modification of the humidity in the air mixture. The air mixture subsequent to conditioning (e.g., modification with respect to temperature, humidity, and pollution such as particulate matter) can then be supplied to the air-return plenum 116, mixed with the heated air in the air-return plenum 116, and cooled by the HVAC units 122.

Even though the HVAC units 122 are primarily responsible for cooling the computing systems and the other electronic components on the data floor 114, the HVAC system 534 can still provide substantial cooling (e.g., up to at least 70 kW) capacity if needed.

Power Centers

FIG. 9 illustrates the power-center building module 120 of the modular datacenter facility 100 in accordance with some embodiments.

FIG. 9 illustrates a block diagram of an embodiment of the power-center building module 120, 220, etc., which is at the heart of the modular datacenter power delivery mechanism for the building modules. With the power-center building module 120 as an example, the power-center building module 120 can be pre-fabricated off site to include electrical power generators, transformers, and modular pre-fabricated mechanical, electrical, and plumbing ("MEP") rooms that house switchgear, Uninterruptable Power Supplies, power controls, etc. The power-center building module 120 can also provide the generator-backed power for the primary and secondary point of presence ("PPOP" and "SPOP") rooms and the house power. The power center building module 120 can have hardened steel shell structure and one or more aligned doors fabricated into the building module in order to interconnect with the connecting corridor, which forms an outer layer of another building module that is adjacent and abutted to the power center building module. The power-center building module 120 can include one to two generators. Each of the generators can be a 2-MW diesel generator in an N configuration to provide back-up power in case of utility power failure, with the second generator as a swing generator. Each generator can be housed in a weatherproof enclosure. The customer has the option to install or not the additional generator to serve as the swing generator supplying backup electrical power to multiple data-floor building modules. The power-center building module 120 can include one or more Power Distribution Units (PDU's). The data-floor building module 110 can have eight PDU's that will serve as the electrical distribution point for the customer. The PDU's can be prefabricated and shipped to the site.

A 2500 kVA outdoor transformer from the Utility Power Grid exists for each 1000 kW modular datacenter facility. The 2500 kVA transformer can provide power for each one of the building modules through dual (A/B) 3000 A switchboards controlled by a 5-breaker PLC in the power center building module 120. The sequence of electrical power supply operation of the system can be controlled automatically through deployment of a programmable logic controller ("PLC") control unit installed in the 3000 A main switchboard. The optional swing generator can be a third source of power available to each modular datacenter. Should the standby generator fail to come online after loss of power from the utility source, the optional swing generator can pick up the critical loads of the system.

The second set of sidewall-connected HVAC units 124 and 224 described herein can be powered by a second electrical power distribution building module 128 and 228 in order to allow an increase in power and cooling capability over time for the data-floor building modules 100 and 200, respectively. The second electrical power distribution building module can be a duplicate of the first electrical power distribution building module. For example, a 2500 kVA transformer can provide power for each one of the building modules through dual (C/D) 3000 A switchboards controlled by a 5-breaker PLC.

The sidewall of the modular datacenter facility can be constructed with the pre-approved architectural design and layout to add the second electrical power distribution module with electrical conduits and trays routed through the sidewall during the second time period of the data-floor building module.

Magnetic Blocking Tiles

Magnetic blocking tiles can be placed on a perforated tile or open area where air could flow through the floor to direct the air flow to areas in the datacenter where electronic equipment is designed to be located and actually is installed in the datacenter. This increases the efficiency of the cooling system of the datacenter facility. The placement of magnetic blocking tiles may cooperate with an air dam installed in the supply air system of the datacenter. FIG. 10 illustrates the placement of the magnetic blocking tiles over perforated tiles of the data hall 114, and FIG. 11 illustrates an example air dam system that cooperate with the placement of magnetic blocking tiles.

FIG. 10 illustrates a diagram of an embodiment of four magnetic blocking tiles placed on perforated tiles or open areas, in an area where electronic equipment, including various computing systems, is designed and planned to be located but currently is not installed.

The magnetic blocking tiles are magnetic covers for perforated or slotted tiles that are safe for a computing environment such as a datacenter. The magnetic blocking tiles each have a top surface that is solid and a bottom surface. Each magnetic blocking tile may have an anti-static rating of at least 10,000 ohms and is made of or coated with a dust-resistant material. The one or more magnetic blocking tiles are designed to be placed on perforated tiles or open areas where air could flow in a datacenter to aid in controlling the air flow in a datacenter. The datacenter houses computing systems, where the computing systems includes servers and storage devices are arranged in hot and cool zones. The magnetic blocking tiles are placed on perforated tiles or open areas where air could flow through the floor. The perforated tiles include any tiles manufactured with slots, small holes, and other openings in the tile to allow air to flow through these openings. The magnetic blocking tiles are placed on these perforated tiles or these open areas, in an area where electronic equipment, including the computing systems, is designed and planned to be located but currently is not installed; and thus, the magnetic blocking tiles cut off the airflow to areas where the electronic equipment is designed and planned to be located but currently is not installed. The magnetic blocking tiles cut off the airflow to areas where the electronic equipment is not installed; and thus, enhances the airflow to areas in the datacenter where electronic equipment is designed to be located and actually is installed in the datacenter. For example, server racks #1 and #3 are still getting the cooling air flow to the area where they are installed. However the area between server racks #1 and #3 has magnetic blocking tiles placed over the perforated tiles in this area. The magnetic blocking tiles adhere magnetically to either the floor or the perforated tiles in order to cut off the airflow to areas where the electronic equipment is not installed.

The magnetic blocking tiles may have a magnetic material incorporated into one of the layers of the magnetic blocking tiles. The magnetic material is used to adhere to either a metal floor or metal perforated tiles without an additional adhesive bonding agent being needed between the magnetic blocking tile and an underlay surface of the metal floor or metal perforated tile. The floor or perforated tile may be made out of a ferrous metal material and/or have a ferrous-metal based resin applied to the floor or perforated tile. The magnetic blocking tiles are configured for a magnetic action to be used to hold the magnetic blocking tile in place. Note, any of 1) a raised floor may be made of a ferrous metal, 2) the perforated tiles are made of a ferrous metal, and 3) a coating, on either of the perforated tiles or on the raised floor, incorporates loose ferrous metal material.

Each magnetic blocking tile may have a magnetic flux, of less than 0.4 Tesla or 1500 Oersted, at which value it is safe to assume that the magnetic field will not harm or alter data bits stored memory devices. Generally less than 1500 Oersted and/or less than 0.4 Tesla is a maximum defined value at which it is safe to assume that no data has had its value changed based on being exposed to the magnetic field. Past this exposure, data may have been altered by the magnetic field. Regardless of exposure to another magnetic force, a memory device such as a hard drive can (and does) lose data bits due to deterioration over time.

The magnetic blocking tiles may have a coating that has an anti-static rating of at least 1000 ohms to 10,000 ohms (or more) to prevent damage to any electronic circuit devices that cannot tolerate a sudden flow of static charge. The magnetic blocking tiles are anti-static to be suitable for use in computer rooms. Electrostatic discharge (ESD) is a problem for computer systems in a data floor. The scuff of a shoe or the scrape of a chair creates an electron imbalance and, while the human body may not feel it, it can have serious consequences. ESD can cause component or system failures, which may prove costly and perhaps even be dangerous. The magnetic blocking tiles may have a static electricity electrical propensity of less than 2 kV by having a conductive carbon based coating to create an anti-static property.

In an embodiment, the dust resistant coating or material of the magnetic blocking tile has a reduced tacticity of a top layer or covering to protect the surface from dust accumulation. The top layer may have small molecules that repel negatively charged dust or may repel dust that could have remained attached by sealing edges, joints, and seems that are vulnerable to dust molecules attaching to these seems, edges and joints.

The top surface of a magnetic blocking tile may have a sufficient friction coefficient of equal to or greater than a 0.30 dynamic coefficient of friction (DCOF) to be slip resistant and give some friction so a person does not easily slip. The top surface of a magnetic blocking tile may be made from material such as vinyl.

Placement the magnetic blocking tiles allows the datacenter operators to refine the heat load being cooled by the HVAC systems of the datacenter to focus on cooling computing systems actually currently installed in the one or more data floors that are already constructed. The magnetic blocking tiles are configured to calibrate datacenter.

The magnetic blocking tiles are configured to cooperate with an air dam installed in the datacenter, where the air-supply plenum 112 includes an under-floor plenum to supply the cooling air to the data floor 114. The air dam is positioned at an entry region of the under floor plenum to obstruct a flow of cooling air in order to cause a constant airflow through the perforations in the perforated tiles for an entire area of datacenter housing the computer systems.

Air Dam

FIG. 11 illustrates a geometry of an air dam 1113 configured with respect to the data room, raised floor, and supply air plenum in accordance with some embodiments.

As discussed, the placement of magnetic blocking tiles may cooperate with an air dam installed in the supply air system of the datacenter. The air dam 1113 works as an obstruction in the forced air flow path to cause the air passing through the opening between the top of the air dam 1113 and the bottom of the wall or raised floor to slow down the air entering the under floor space. The air on the opposing side of the air dam from the incoming air stream experiences a more even pressure distribution. The air dam also creates a positive air pressure over the air dam, thus reducing and eliminating negative pressures areas in the data room floor. The air dam is located under a raised floor building such as a datacenter and is typically located under the walls forming a room in the building in the flow path of forced air in that building. Additional localized air dams may be placed and orientated by high heat centers in a room to direct airflow to that localized hot spot. The air dam can be located between the slab of the foundation and the support structure for the raised floor.

FIG. 11 illustrates the air dam 1113 configured with respect to the air-supply plenum 112 along the full width of one vertical wall of the data floor 114 transitioning to the under-floor plenum between a perforated, raised floor and an actual floor of the data-floor building module 110. The air-supply plenum 112 has a width (w) from an exterior wall of the modular datacenter facility 100 to an interior wall (e.g., a wall of the rear service corridor 132 or a wall of the data hall 114), while the raised floor is raised by a height (y). The raised floor has a length (L) from the interior wall to an opposing interior wall of the data floor 114. Dimensions include a width (w) of the air-supply plenum 112 and a height (y) of the raised floor of between 12 to 48 inches, preferably between 30 to 42 inches, and more preferably approximately 36 inches. These dimensions are not necessarily the same, but can be.

The air dam 1113 can be an angled bracket that includes two planar sides generally angled from each other. The first side secures the dam to the actual floor and is positioned parallel to the floor along one surface, while the second side projects from the floor at an angle θ into the under floor space. The air dam 1113 may be angled from the floor from between 45-135° and more generally between 45-90°. The angle of the air dam 1113 preferably positions the top edge of the air dam 1113 equal or closer to the exterior wall than a bottom portion of the air dam 1113 that projects into the under floor space (i.e. less than or equal to 90° when measured from the exterior side of the air dam 1113).

However, the size and shape of the air dam 1113 may vary. In some embodiments, the air dam may have an 'L' type shape with the height of the L section being roughly half the height of the raised floor. The size and shape of the air dam causes a constant pressure through the perforated tiles when entering into the data floor to cool its electronic equipment. The angle of the vertical section of the air dam may vary between 45° and 120°, with a preferred angle of 90° or less, measured from the floor on the exterior side of the air dam. The placement of the air dam may be offset relative to the wall starting that room by a given distance of between approximately 6 to 18 inches. The size and shape of the air dam is formed to cause a turbulent airflow effect underneath the raised floor and then through the perforations in tiles on a surface of the raised floor in order to create the constant pressure through the perforated tiles. In some embodiments, the air dam may be a planar surface of generally equal thickness along the projection, such that the projection is generally rectangular in cross section. The thickness of planar surface may also be tapered or reverse tapered toward the upper edge, such that the planar surface is thicker or thinner along a bottom portion of the surface than toward a top edge of the surface, such that the surfaces creates a generally triangular or trapezoidal cross section. The taper may also be non-linear such that the surface is non-planar, concave or convex toward the incoming air stream. In some embodiments, the air dam 1113 is a planar or generally planar projection from the floor toward the raised floor perpendicularly oriented from the floor at approximately half of the height between the floor to the underside of the raised floor.

The air dam may be made of one or more plastic, metal, carbon, polymer, composites or combinations thereof. The air dam should be sufficiently rigid to maintain is shape and orientation against the force and pressure of the incoming air stream.

The top edge of the air dam projects into the under floor space of the under floor plenum. The air dam 1113 creates a barrier or obstacle to the air flow as it transitions from the air-supply plenum 112 to the under floor plenum portion of the air-supply plenum 112. The air dam 1113 is positioned to obstruct the air flow and generally reduce the velocity of the air flow entering the under floor plenum. Accordingly, the top edge of the air dam is positioned between 25% to 75%, and preferably between 40% to 60% and more preferably about 50% of the height of the under floor plenum from the actual floor toward the raised floor. Therefore, an air passage is created over the top of the air dam 1113 between the air dam and the raised floor. The air dam has a maximum height (h) measured from the actual floor toward the raised floor. The air dam 1113 height (h) may be approximately 12-24 inches, preferably 16 to 20 inches, and more preferably 18 inches.

The air dam 1113 may be positioned at an offset from the exterior side of the interior wall toward the under floor plenum, i.e. toward the interior of the data floor 114 or away from an exterior wall of the modular datacenter facility 100. In an embodiment, the air dam 1113 may be offset from the exterior side of the interior wall by 0-5% of the length of raised floor length (L), and more specifically from 0.5 to 1.5% of the length of the raised floor. Alternatively, the air dam 1113 may be offset from the exterior side of the interior wall by a distance equal to or less than the width (w) of the air-supply plenum 112 and/or the height (y) of the under floor plenum portion of the air-supply plenum 112. Preferably, the air dam 1113 is offset (x) by approximately ¼ to ½ of the air-supply plenum width (w) and/or air-supply plenum height (y). In an embodiment, the air dam 1113 may be offset from the exterior side of the interior wall by 0 to 24 inches, 6 to 18 inches, or preferably 10 to 14 inches.

The offset placement tends to control where the constant air pressure and thus air flow in cubic feet per minute (CFM) begins. The constant airflow caused by the air dam through the under floor system to the entire room of the data floor tends to minimize or eliminate hotspots from occurring inside the room. This allows greater freedom of placement and arrangement of electrical equipment inside the data room than ever before. Additionally, a layout of electrical equipment can be altered and changed in the future without having to potentially change any HVAC ducting, HVAC cooling units, etc. and potentially with only a minimal amount of switching around or adding of perforated tiles to affect the airflow in that area of the data floor room. The even air pressure distribution caused by the air dam in the under floor plenum, which results in a constant airflow through the perforated floor system, allows an electrical equipment layout in the data floor with even smaller dimensions for hot and cold aisles than standard configurations. For example, 3 foot or less hot aisles and/or 4 foot or less cold aisles may be achieved with embodiments described herein. Thus, the placement of electrical equipment such as servers, storage devices, etc. can be freely placed in any geographical area in the data room rather than having to set up the equipment in a prescribed/pre-designed manner.

The air dam 1113 is configured and positioned to create a generally even distribution of pressure in the under floor plenum across the entirety of the raised floor. Alternatively, embodiments as described herein may be used to control the pressure distribution across a majority of or substantial portion of the raised floor. For example, the pressure distribution at the raised floor on the under floor plenum side of the air dam may be controlled for generally constant pressure. Accordingly, approximately 90-100%, and preferably 95-100% of the floor length experiences constant pressure distribution of the injected air. The portion of generally constant pressure may be measured across the entire raised floor. Generally, even distribution of pressure is understood to be a pressure distribution more homogeneous than that achieved without an air dam. For example, the desired pressure distribution across the raised floor is maintained at or above 0.04 inches of water, and preferably between 0.04 to 0.07 and more preferably between 0.05 and 0.06. Accordingly, the pressure distribution across the raised floor may vary in embodiments by 0.04 inches of water, and more preferably by 0.02 inches of water across the entire raised floor. The pressure distribution across a majority of substantial portion of the raised floor may vary by 0.01 inches of water or less and more preferably by 0.05 inches of water. Embodiments as described herein may achieve a positive pressure distribution across the entire raise floor with a pressure variation of less than 25% of an average pressure across the raised floor, and more preferably of less than 20%, 10%, or 5%.

Embodiments as described herein may achieve more efficient distribution of air into the data room. For the same amount of energy to supply an incoming air source at a given velocity and/or pressure, the pressure achieved within the data room without the air dam is substantially reduced. For example, for the same source velocity and pressure, the air pressure across the raised floor may be improved by 2-3 times. Thus, pressures of only 0.02 to 0.03 inches water may be achieved with contemporary systems without an air dam, while pressures of 0.06 to 0.07 inches water may be achieved with the same source supply conditions with a system incorporating embodiments described herein.

The HVAC cooling units 122, 124, 222, 224, etc. and cooling system overall perform better to consume less electrical energy to supply a given amount of cooling for a given amount of electrical consumption by the electrical equipment contained inside the data floor room. For example, due to the constant airflow and consistent pressure, a 10,000 square-foot data room can fit 500 racks of electrical equipment in multiple layouts and arrangements inside that data room floor space of 10,000 feet. The same HVAC units and air dam placement can be used to support those multiple configurations of electrical equipment within the data floor of the datacenter.

Methods

FIG. 12 illustrates a method 1200 of the modular datacenter facility 100 in accordance with some embodiments.

In a first step 1210 of the method, the method can include constructing a modular datacenter facility with at least an initial set of building modules of different types of functionality to form the modular datacenter facility. Each type of building module in the set can have a specific collection of functionality associated with that type of building module. Each building module of the set can be a pre-engineered, standardized building block having a standardized, pre-approved architectural design and layout. A first type of building module in the modular datacenter facility can be a data-floor building module that is pre-engineered and has the pre-approved architectural design and layout to house computing systems.

In a second step 1220 of the method, the method can include housing, in hot and cool zones of a data-floor building module, computing systems including servers and storage devices, as well as routers and switches, to transport data traffic between the servers and a world exterior to the modular datacenter facility.

In a third step 1230 of the method, the method can include connecting a first set of sidewall-connected HVAC units for the data-floor building module to a sidewall of the modular datacenter facility and using electrical power provided by a first electrical power distribution building module to supply conditioned air into an air-supply plenum of the sidewall. The sidewall can be a sidewall of the data-floor building module or a service corridor. The conditioned air can be supplied in order to cool the computing systems including the servers, storage devices, routers, and switches, and other electronic components housed in the data-floor building module of the modular datacenter facility. The first set of the sidewall-connected HVAC units can allow for cooling of the computing systems and the other electronic components allowing for more server units to consume electrical power during their operation inside the data-floor building module without raising a temperature in the data-floor building module high enough to overheat the computing systems and the other electronic components. The first set of the sidewall-connected HVAC connecting to the sidewall units can allow for fewer penetrations in a roof of the data-floor building module, thereby minimizing an amount of leaks potentially occurring in the roof of the ceiling, and thereby minimizing risk of any damage to the computing systems and the other electronic components housed in the data-floor building module from the leaks.

In a fourth step 1240 of the method, the method can include sealing a roof with a vapor-to-air sealant layer on top of a concrete layer to further prevent leaks from potentially occurring in the data-floor building module from in through the roof.

In such embodiments, the method can further include a fifth step including constructing an air channel, including any of a duct, a plenum, and a combination of one or more ducts and plenums for an air-flow path for the conditioned air beginning at the first set of the sidewall-connected HVAC units, through the air-supply plenum of the sidewall, through an under-floor plenum positioned under a raised floor of the data-floor building module, through the raised floor of the data-floor building module, through one or more perforated tiles covering the raised floor, and into an interior of the data-floor building module for the cooling of the computing systems and the other electronic components housed in the data floor building module.

In such embodiments, the method can further include a sixth step including constructing the air channel for the air-flow path of the conditioned air to continue from the interior of the data-floor building module and through a ceiling of the of the data-floor building module, where one or more return ducts above the ceiling route heated air from above the data-floor building module down along the sidewall and back to an air intake of the first set of the sidewall-connected HVAC units. The first set of the sidewall-connected HVAC units can remove heat from the heated air to provide the conditioned air for recirculation of the conditioned air through the air channel, including through the air-supply plenum of the sidewall, through the under-floor plenum, and through the raised floor of the data-floor building module for the cooling of the computing systems and the other electronic components.

In such embodiments, the method can further include a seventh step including configuring the first set of the sidewall-connected HVAC units with heat exchangers to remove heat from recirculating conditioned air inside the data-floor building module without introducing air from outside the data-floor building module, thereby preventing outside air with humidity and potential pollution from mixing with the recirculating conditioned air inside the data-floor building module, and thereby minimizing damage to the computing systems and the other electronic components housed in the data-floor building module. The first set of the sidewall-connected HVAC units can use the heat exchangers rather than louvers to remove the heat from the recirculating conditioned air supplied to the air channel from inside the data-floor building module.

In such embodiments, the method can further include a eighth step including configuring the first set of the sidewall-connected HVAC units with the heat exchangers to work with at least one other HVAC unit that brings in the outside air as makeup air to make up for losses in the recirculated conditioned air. The at least one other HVAC unit can include a humidity-control system and a pollution-control system configured to control the humidity and the potential pollution of the makeup air that enters the modular datacenter facility for the losses in the recirculated conditioned air.

In such embodiments, the method can further include a ninth step including adding an additional one or more sets of the building modules of the different types to the initial set of the building modules upon a parcel of land when a need of space and additional capacity of the modular datacenter facility develops, thereby transforming the modular datacenter facility by a step-by-step approach carried out over time by addition of the additional one or more sets of the building modules of the different types. The ninth step can further include architecting one or more connecting corridors into the building modules of the different types. And the ninth step can further include aligning doorways between the building modules of the different types interconnecting at least two building modules adjacent and abutted to each other.

In such embodiments, the method can further include a tenth step including constructing the air supply plenum and an air return channel of the sidewall of the modular datacenter facility. The air-supply plenum and the air-return plenum of the sidewall of the modular datacenter facility can have the pre-approved architectural design and layout for adding additional sidewall-connected HVAC units at a later date from initial construction of the modular datacenter facility with the initial set of building modules of the different types of functionality.

In such embodiments, the method can further include a eleventh step including configuring the first set of the sidewall-connected HVAC units to allow the first set of the sidewall-connected HVAC units to be installed during a first time period of the data-floor building module to cool the computing systems and the other electronic components housed in the data-floor building module during the first time period. At a second, later time period of the data-floor building module, the eleventh step can further include configuring the first set of the sidewall-connected HVAC units to allow a second set of the sidewall-connected HVAC units to be proximately installed and connected into the air-supply plenum and the air-return plenum of the sidewall to cool the computing systems and the other electronic components housed in the data-floor building module during the second time period of the data-floor building module.

In such embodiments, the method can further include a twelfth step including installing the second set of the sidewall-connected HVAC units with the pre-approved architectural design and layout selected from the group consisting of i) horizontally along the sidewall of the modular datacenter facility in line with the first set of the sidewall-connected HVAC units, ii) vertically up the sidewall of the modular datacenter facility in a configuration on top of the first set of the sidewall-connected HVAC units, or iii) in a combination of horizontally along the sidewall of the modular datacenter facility and vertically up the sidewall of the modular datacenter facility in the configuration on top of the first set of sidewall-connected HVAC units. The twelfth step can further include powering the second set of sidewall-connected HVAC units by a second electrical power distribution building module in order to allow an increase in power and cooling capability over time for the data-floor building module. The sidewall of the modular datacenter facility can be constructed with the pre-approved architectural design and layout to add the second electrical power distribution module with electrical conduits and trays routed through the sidewall during the second time period of the data-floor building module.

In such embodiments, the method can further include a thirteenth step including horizontally connecting two parallel sections of wall of a data-hall building module of the initial set of the building modules with a steel-based joist or concrete beam to eliminate a need for support columns on a raised floor of the data-hall building module to support the computing systems and the other electronic components. The steel-based joist or concrete beam can ensure that users of the data-floor building module have a sufficient degree of flexibility to accommodate a number of server-rack configurations for racks of the servers having varying power consumption densities in the hot and the cool zones of the data-hall building module. The raised floor can house the computing systems and other electronic components as well as create a single, under-floor plenum configured for supplying the conditioned air under the raised floor to an interior of the data-hall building module and returning heated air to a return plenum or return ducts in a ceiling above the data-floor building module for return of the heated air to the first set of sidewall-connected HVAC units.

In such embodiments, the method can further include a fourteenth step including constructing a service corridor and a personnel corridor along a length of at least some of the initial set of building modules connected in the modular datacenter facility. A hardened-structure building module of the initial set of building modules can include a hardened shell and one or more service or personnel corridors between a first instance of the hardened-structure building module and a second instance of the hardened-structure building module connecting to and abutting the first instance of the hardened-structure building module. The one or more service or personnel corridors can be laid out between an interior wall and an exterior wall of the hardened-structure building module forming the hardened shell of the hardened-structure building module. The roof further can include an insulation layer and a cover-board layer on top of the vapor-to-air sealant layer.

While some specific embodiments of the design have been shown, the design is not to be limited to these embodiments. The design is to be understood as not limited by the specific embodiments described herein, but only by the scope of the appended claims. Moreover, specific components and various embodiments have been shown and described. It should be understood that the invention covers any combination, sub-combination, or re-combination, including duplicating components, subtracting components, combination components, integrating components, separating components, and/or dividing components.

The terms "approximately" and "about" are used interchangeably to indicate that the disclosed and suggested values do not require exact precision. The relative inclusions of values around each value depends on the error in building, manufacturing, and installing the components, as is generally practiced by a person of skill in the art. Even without the specific identification of approximation (i.e. the term "about" or "approximate"), all of the dimensions disclosed are examples only and include equivalent or approximate values to the stated value to achieve similar, equal, or better benefits or effects to those of the disclosed dimensions. "Majority" is understood to be more than 50% of the floor area, while "substantial" is understood to be at least more than 75% of the floor and preferably more than 85% of the floor area.

What is claimed is:

1. An apparatus, comprising:
a modular datacenter facility constructed with at least an initial set of building modules of different types of functionality to form the modular datacenter facility,
wherein a first type of building module in the modular datacenter facility is a data-floor building module to house computing systems where the data room has an under floor plenum and a roof,
wherein a first set of sidewall-connected heating, ventilation, and air conditioning ("HVAC") units for the data-floor building module connect to a sidewall of the modular datacenter facility to supply conditioned air into an air-supply plenum of the sidewall in order to cool, via indirect airside economizer without dehumidification, wherein the first set of the sidewall-connected HVAC units have heat exchangers to remove heat from recirculating conditioned air inside the data-floor building module and exchange the heat to air outside the data-floor building module without introducing air from outside the data-floor building module in order to control moisture in an environment of the data-floor building module,
wherein the first set of the sidewall-connected HVAC units cooperate with an air dam to supply the cooling air to the data floor, where the air dam is positioned at an entry region of an under floor plenum to obstruct a flow of the cooling air to flow between a top area of the air dam and a raised floor of the data-floor building module in order to create a positive air pressure over the air dam and mitigate negative pressures areas in the data-floor building module, and
wherein the first set of the sidewall-connected HVAC units connecting to the sidewall allow for fewer penetrations in the roof of the data-floor building module, thereby minimizing an amount of leaks potentially occurring in the roof and minimizing risk of any damage to the computing systems.

2. The apparatus of claim 1,
wherein the air dam is located under the raised floor of the data-floor building module and a wall of the data-floor building module; and
wherein the air dam is positioned angularly to the raised floor of the data-floor building module between forty-five degrees and one-hundred and thirty-five degrees.

3. The apparatus of claim 1,
where one or more return ducts above a ceiling route heated air from above the data-floor building module down along the sidewall and back to an air intake of the first set of the sidewall-connected HVAC units, and
wherein the first set of the sidewall-connected HVAC units remove heat from the heated air to provide the conditioned air for recirculation of the conditioned air through the air channel, including through the air-supply plenum of the sidewall, through the under-floor plenum, and through the raised floor of the data-floor building module for the cooling of the computing systems and the other electronic components.

4. The apparatus of claim 1,
wherein the first set of the sidewall-connected HVAC units with the heat exchangers to remove heat from the recirculating conditioned air inside the data-floor building module without introducing air from outside the data-floor building module, in order to prevent outside air with humidity and potential pollution from mixing with the recirculating conditioned air inside the data-floor building module, and thereby minimizing damage to the computing systems and the other electronic components housed in the data-floor building module, and wherein the first set of the sidewall-connected HVAC units use the heat exchangers rather than louvers to remove the heat from the recirculating conditioned air supplied to the air channel from inside the data-floor building module.

5. The apparatus of claim 4, wherein the first set of the sidewall-connected HVAC units configured with the heat exchangers are further configured to work with at least one other HVAC unit that brings in the outside air as makeup air to make up for losses in the recirculated conditioned air, and wherein the at least one other HVAC unit includes a humidity-control system and a pollution-control system configured to control the humidity and the potential pollution of the makeup air that enters the modular datacenter facility for the losses in the recirculated conditioned air.

6. The apparatus of claim 1, wherein the air dam is placed and orientated below one of the computer systems corresponding to a localized hot spot within the data-floor building module to direct airflow to the localized hot spot.

7. The apparatus of claim 1, wherein the first set of the sidewall-connected HVAC units are configured to cool the computing systems during a first time period, and then, at a second, later time period, the first set of the sidewall-connected HVAC units are configured to allow a second set of the sidewall-connected HVAC units, proximately installed and connected into the air-supply plenum and the air-return plenum of the sidewall, to cool the computing systems housed in the data-floor building module during the second time period different than the first time period.

8. The apparatus of claim 7, wherein the second set of the sidewall-connected HVAC units are installed with the pre-approved architectural design and layout selected from the group consisting of
  i) horizontally along the sidewall of the modular datacenter facility in line with the first set of the sidewall-connected HVAC units,
  ii) vertically up the sidewall of the modular datacenter facility in a configuration on top of the first set of the sidewall-connected HVAC units,
  iii) or a combination of horizontally along the sidewall of the modular datacenter facility and vertically up the sidewall of the modular datacenter facility in the configuration on top of the first set of sidewall-connected HVAC units, wherein the second set of sidewall-connected HVAC units are powered by a second electrical power distribution building module in order to allow an increase in power and cooling capability over time for the data-floor building module, and wherein the sidewall of the modular datacenter facility is constructed with the pre-approved architectural design and layout to add the second electrical power distribution module with electrical conduits and trays routed through the sidewall during the second time period of the data-floor building module.

9. The apparatus of claim 1, wherein a data-hall building module of the initial set of the building modules includes a steel-based joist or concrete beam that horizontally connects two parallel sections of wall of the data-hall building module to eliminate a need for support columns on a raised floor of the data-hall building module for supporting the computing systems and the other electronic components, wherein the steel-based joist or concrete beam ensures that users of the data-floor building module have a sufficient degree of flexibility to accommodate a number of server-rack configurations for racks of the servers having varying power consumption densities in the hot and the cool zones of the data-hall building module, and wherein the raised floor houses the computing systems and other electronic components as well as creates a single, under-floor plenum configured for supplying the conditioned air under the raised floor to an interior of the data-hall building module and returning heated air to a return plenum or return ducts in a ceiling above the data-floor building module for return of the heated air to the first set of sidewall-connected HVAC units.

10. The apparatus of claim 1, wherein additional air dams are placed and oriented below higher heat areas proximate to the computing systems situated on the raised below to direct airflow to the higher heat areas.

11. A method, comprising:

constructing a modular datacenter facility with at least an initial set of building modules of different types of functionality to form the modular datacenter facility, wherein a first type of building module in the modular datacenter facility is a data-floor building module to house computing systems where the data room has an under floor plenum and a roof;

connecting a first set of sidewall-connected heating, ventilation, and air conditioning ("HVAC") units for the data-floor building module to a sidewall of the modular datacenter facility to supply conditioned air, via indirect airside economizer without dehumidification, into an air-supply plenum of the sidewall in order to cool the computing systems housed in the data-floor building module of the modular datacenter facility, configuring the first set of the sidewall-connected HVAC units to have heat exchangers to remove heat from recirculating conditioned air inside the data-floor building module and exchange the heat to air outside the data-floor building module without introducing air from outside the data-floor building module in order to control moisture in an environment of the data-floor building module, configuring the first set of the sidewall-connected HVAC units to cooperate with an air dam to supply the cooling air to the data floor, where the air dam is positioned at an entry region of an under floor plenum to obstruct a flow of the cooling air to flow between a top area of the air dam and a raised floor of the data-floor building module in order to create a positive air pressure over the air dam and mitigate negative pressures areas in the data-floor building module, and configuring the first set of the sidewall-connected HVAC units connecting to the sidewall allow for fewer penetrations in the roof of the data-floor building module, thereby minimizing an amount of leaks potentially occurring in the roof and minimizing risk of any damage to the computing systems.

12. The method of claim 11, further comprising:
configuring the air dam to be positioned at an angle between 45 degrees and 135 degrees from a raised floor of the data-floor building module, and
configuring the air dam to be located under the raised floor and a wall of the data-floor building module.

13. The method of claim 11, further comprising:
constructing one or more return ducts above the ceiling route heated air from above the data-floor building module down along the sidewall and back to an air intake of the first set of the sidewall-connected HVAC units,
wherein the first set of the sidewall-connected HVAC units remove heat from the heated air to provide the conditioned air for recirculation of the conditioned air through the air channel, including through the air-supply plenum of the sidewall, through the under-floor plenum, and through the raised floor of the data-floor building module for the cooling of the computing systems and the other electronic components.

14. The method of claim 11, further comprising:
configuring the first set of the sidewall-connected HVAC units with heat exchangers to remove heat from recirculating conditioned air inside the data-floor building module without introducing air from outside the data-floor building module, thereby preventing outside air with humidity and potential pollution from mixing with the recirculating conditioned air inside the data-floor building module, and thereby minimizing damage to the computing systems and the other electronic components housed in the data-floor building module,
wherein the first set of the sidewall-connected HVAC units use the heat exchangers rather than louvers to remove the heat from the recirculating conditioned air supplied to the air channel from inside the data-floor building module.

15. The method of claim 14, further comprising:
configuring the first set of the sidewall-connected HVAC units with the heat exchangers to work with at least one other HVAC unit that brings in the outside air as makeup air to make up for losses in the recirculated conditioned air,
wherein at least one other HVAC unit includes a humidity-control system and a pollution-control system configured to control the humidity and the potential pollution of the makeup air that enters the modular datacenter facility the losses in the recirculated conditioned air.

16. The method of claim 11, further comprising:
configuring the air dam to be directly below a first computing system of the computing systems corresponding to a localized hot spot within the data-floor building module to direct airflow to the localized hot spot.

17. The method of claim 11, further comprising:
constructing the air supply plenum and an air return channel of the sidewall of the modular datacenter facility,
wherein the air-supply plenum and the air-return plenum of the sidewall of the modular datacenter facility have the pre-approved architectural design and layout for adding additional sidewall-connected HVAC units at a later date from initial construction of the modular datacenter facility with the initial set of building modules of the different types of functionality,
configuring the first set of the sidewall-connected HVAC units to cool the computing systems housed in the data-floor building module during a first time period; and
configuring the first set of the sidewall-connected HVAC units to allow a second set of the sidewall-connected HVAC units, proximately installed and connected into the air-supply plenum and the air-return plenum of the sidewall, to cool the computing systems housed in the data-floor building module during a second time period.

18. The method of claim 17, further comprising:
installing the second set of the sidewall-connected HVAC units with the pre-approved architectural design and layout selected from the group consisting of
i) horizontally along the sidewall of the modular datacenter facility in line with the first set of the sidewall-connected HVAC units,
ii) vertically up the sidewall of the modular datacenter facility in a configuration on top of the first set of the sidewall-connected HVAC units, or
iii) in a combination of horizontally along the sidewall of the modular datacenter facility and vertically up the sidewall of the modular datacenter facility in the configuration on top of the first set of sidewall-connected HVAC units; and
powering the second set of sidewall-connected HVAC units by a second electrical power distribution building module in order to allow an increase in power and cooling capability over time for the data-floor building module,
wherein the sidewall of the modular datacenter facility is constructed with the pre-approved architectural design and layout to add the second electrical power distribution module with electrical conduits and trays routed through the sidewall during the second time period of the data-floor building module.

19. The method of claim 11, further comprising:
configuring one or more additional air dams to be placed and oriented below one or more of the computing systems other than the first computing system to direct airflow to one or more other localized hot spots within the data-floor building module.

* * * * *